United States Patent [19]
Kawawake et al.

[11] Patent Number: 6,031,692
[45] Date of Patent: Feb. 29, 2000

[54] MAGNETORESISTIVE DEVICE AND MAGNETORESISTIVE HEAD

[75] Inventors: Yasuhiro Kawawake, Uji; Mitsuo Satomi, Katano; Hiroshi Sakakima, Kyoto, all of Japan

[73] Assignee: Matsushita Electric Industrial Co., Ltd., Osaka, Japan

[21] Appl. No.: 09/223,663

[22] Filed: Dec. 30, 1998

Related U.S. Application Data

[62] Division of application No. 08/802,711, Feb. 19, 1997, Pat. No. 5,909,345.

[30] Foreign Application Priority Data

| Feb. 22, 1996 | [JP] | Japan | 8-034556 |
| Mar. 18, 1996 | [JP] | Japan | 8-060513 |
| Apr. 5, 1996 | [JP] | Japan | 8-083674 |
| May 22, 1996 | [JP] | Japan | 8-126743 |

[51] Int. Cl.$^7$ .................................................. G11B 5/39
[52] U.S. Cl. ......................................................... 360/113
[58] Field of Search ............................................. 360/113

[56] References Cited

U.S. PATENT DOCUMENTS

| 5,673,162 | 9/1997 | Saito | 360/113 |
| 5,828,529 | 10/1998 | Gill | 360/113 |

FOREIGN PATENT DOCUMENTS

| 0674327 | 9/1995 | European Pat. Off. . |
| 0780912 | 6/1997 | European Pat. Off. . |
| 536033 | 2/1993 | Japan . |
| 8-167120 | 6/1996 | Japan . |
| 8-213238 | 8/1996 | Japan . |

OTHER PUBLICATIONS

Search Report for EPO Application No. 97102826.1; dated Jan. 12, 1998.

H. Saikama et al, Journal of Magnetism and Magnetic Materials 165; (1997); pp. 108–110; "Magnetoresistance in CoMnB/Co(Fe)/Cu/Co(Fe) Spin–Valves".

M. N. Baibich et al., Physical Review Letters, vol. 61, pp. 2472–2475, 1988, "Giant Magnetoresistance of (001) Fe/(001)Cr Magnetic Superlattices".

S.S.P. Parkin et al., Physical Review Letters, vol. 64, pp. 2304–2307, 1990, "Oscillations in Exchange Coupling and Magnetoresistance in Metallic Superlattice Structure: Co/Ru, Co/Cr, and Fe/Cr".

T. Shinjo et al., Journal of the Physical Society of Japan, vol. 59, No. 9, pp. 3061–364, 1990, "Large Magnetoresistance of Field–Induced Giant Ferrimagnetic Multilayers".

M. Satomi et al., Technical Report by the Institute of Electronics, Information and Communication Engineers of Japan, 1991. (with partial English translation).

B. Dieny et al., Journal of Magnetism and Magnetic Materials 93, pp. 101–104, 1991, "Spin–Valve Effect in Soft Ferromagnetic Sandwiches".

M. Jimbo et al., Japanese Journal of Applied Physics, vol. 34, pp. L112–L114, 1995, "Giant Magnetoresistance Effect in Amorphous CoFeB Sandwiches".

Pending U.S. Patent application Ser. No. 08/802,709; filed on Feb. 19, 1997; entitled "Thin Film Magnetic Head".

Pending U.S. Patent application Ser. No. 08/429.714; filed on Apr. 27, 1995; entitled "Magnetoresistance Effect Device, and Magnetoresistance Effect Type Head, Memory Device, and Amplifying Device Using the Same".

*Primary Examiner*—Robert S. Tupper
*Attorney, Agent, or Firm*—Renner, Otto, Boiselle & Sklar, P.L.L.

[57] ABSTRACT

A magnetoresistive device of the present invention includes: a soft magnetic layer; a hard magnetic layer; a non-magnetic layer formed between the soft magnetic layer and the hard magnetic layer; and an interface magnetic layer, provided at an interface between the soft magnetic layer and the non-magnetic layer, for enhancing magnetic scattering, wherein the soft magnetic layer includes an amorphous structure.

33 Claims, 12 Drawing Sheets

MAGNETORESISTIVE DEVICE AND MAGNETORESISTIVE HEAD

This application is a divisional of prior application Ser. No. 08/802,711, filed Feb. 19, 1997 now U.S. Pat. No. 5,909,345.

BACKGROUND OF THE INVENTION

1. Field of the Invention

The present invention relates to a magnetoresistive device in which a large change in magnetoresistance is caused in a low magnetic field, and also relates to a magnetoresistive head which is configured using such a magnetoresistive device and is suitable for high-density magnetic recording and reproducing operations.

2. Description of the Related Art

A magnetoresistive sensor (hereinafter, simply referred to as an "MR sensor") and a magnetoresistive head (hereinafter, simply referred to as an "MR head") using a magnetoresistive device (hereinafter, simply referred to as an "MR device) have been under development. The term "a magnetoresistive device" indicates a device which varies an electric resistance depending on the magnetic field externally applied. The characteristic of the MR device is generally represented by a ratio of change of magnetoresistance (hereinafter abbreviated as an MR ratio). The MR ratio is defined by the following equation:

$$\text{MR ratio}(\%) = (R(\text{maximum}) - R(\text{minimum})) / R(\text{minimum}) \times 100$$

where R(maximum) and R(minimum) denote the maximum value and the minimum value of the resistance of the MR device when a magnetic field is applied to the MR device.

Conventionally, a permalloy made of $Ni_{0.8}Fe_{0.2}$ or an alloy layer made of $Ni_{0.8}Co_{0.2}$ is mainly used as the magnetic body. In the cases where such magnetoresistive materials are used, the MR ratio is about 2.5%. In order to develop an MR device having higher sensitivity, an MR device having a higher MR ratio is required. It was recently found that [Fe/Cr] and [Co/Ru] artificial multilayers in which antiferromagnetic coupling is attained via a metal non-magnetic thin layer made of a material such as Cr and Ru exhibit a giant magnetoresistance (GMR) effect in a ferromagnetic field (1 to 10 kilooersteds (kOe)) (Physical Review Letter Vol. 61, p. 2472, 1988; and Physical Review Letter Vol. 64, p. 2304, 1990). However, since these artificial multilayers require a magnetic field of several to several tens of kOe in order to attain a large MR change, such artificial multilayers cannot be practically applied to a magnetic head and the like.

In addition, it was also found that an [Ni—Fe/Cu/Co] artificial multilayer using magnetic thin layers made of Ni—Fe and Co having different coercive forces in which they are separated by a metal non-magnetic thin layer made of Cu and which are not magnetically coupled exhibits a giant magnetoresistance effect, and an artificial multilayer which has an MR ratio of about 8% when a magnetic field of about 0.5 kOe is applied at room temperature has been hitherto obtained (see Journal of Physical Society of Japan, Vol. 59, p. 3061, 1990). However, in the case of using an MR material of such a type, a magnetic field of about 100 Oe is required for attaining a large MR change. Moreover, the MR asymmetrically varies from the negative magnetic field to the positive magnetic field, i.e., the MR exhibits poor linearity. Thus, such an artificial multilayer has characteristics which are not suitable for practical use.

Moreover, it was also found that [Ni—Fe—Co/Cu/Co] and [Ni—Fe—Co/Cu] artificial multilayers using magnetic thin layers made of Ni—Fe—Co and Co in which RKKY-type antiferromagnetic coupling is attained via Cu exhibit a giant magnetoresistance effect, and an artificial multilayer which has an MR ratio of about 15% when a magnetic field of about 0.5 kOe is applied at room temperature has been hitherto obtained (see Technical Report by THE INSTITUTE OF ELECTRONICS, INFORMATION AND COMMUNICATION ENGINEERS of Japan, MR91-9). However, in the case of using an MR material of such a type, the magnetoresistance varies substantially linearly from zero to the positive magnetic field and characteristics which are sufficiently suitable for the application to an MR sensor are obtained. Nevertheless, in order to obtain a large MR change, a magnetic field of about 50 Oe is also required. Thus, such a characteristic of the film is not appropriate for the application to an MR magnetic head which is required to be operated at most at 20 Oe and preferably less.

As a film which can be operated even when a very weak magnetic field is applied, a spin-valve type film in which Fe—Mn as an antiferromagnetic material is attached to Ni—Fe/Cu/Ni—Fe has been proposed (see Journal of Magnetism and Magnetic Materials 93, p. 101, 1991). The operating magnetic field of an MR material of this type is actually weak, and a good linearity is observed. However, the MR ratio thereof is as small as about 2%, and the Fe—Mn layer has a poor corrosion resistance and a low Neel temperature, so that the device characteristics disadvantageously exhibit great temperature dependence.

Furthermore, a spin-valve film having a structure of Ni—Fe/Cu/Co—Pt or the like including a hard magnetic material such as Co—Pt instead of an antiferromagnetic material has also been suggested. In such a case, a parallel alignment of the magnetizations and an antiparallel alignment of the magnetizations are caused by rotating the magnetization direction of a soft magnetic layer at a coercive force equal to or less than that of a hard magnetic layer. However, even when such a structure is employed, it is still difficult to improve the soft magnetic characteristics of a soft magnetic layer. Thus, this structure has not been used practically, either.

In conventional magnetoresistive devices utilizing a giant magnetoresistance effect, a crystalline Ni—Fe alloy or Ni—Fe—Co alloy is used for a soft magnetic layer. Thus, such magnetoresistive devices cannot totally eliminate magnetocrystalline anisotropy. Consequently, in such conventional magnetoresistive devices, the soft magnetic characteristics thereof are still poor and the operating magnetic field thereof cannot be strong.

On the other hand, it was recently reported that a magnetoresistance effect of about 5.4% is attainable even in a spin-valve film having a structure of Co—Fe—B/Cu/Co including a soft magnetic layer made of a Co—Fe—B amorphous alloy (see Japanese Journal of Applied Physics, Vol. 34, pp. L112–L114, 1995). Since an amorphous alloy layer used as a soft magnetic layer exhibits more satisfactory soft magnetic characteristics as compared with those of a conventional crystalline Ni—Fe alloy layer or Ni—Fe—Co alloy layer, a magnetoresistive device having higher magnetic field sensitivity can be fabricated. However, in the spin-valve film including the Co—Fe—B/Cu/Co structure, it was difficult to simultaneously fulfill the incompatible purposes of obtaining a sufficiently large MR ratio and a sufficiently high magnetic field sensitivity.

SUMMARY OF THE INVENTION

According to one aspect of the present invention, a magnetoresistive device includes: a soft magnetic layer; at least one hard magnetic layer; at least one non-magnetic layer formed between the soft magnetic layer and the at least one hard magnetic layer; and an interface magnetic layer, provided at an interface between the soft magnetic layer and the at least one non-magnetic layer, for enhancing magnetic scattering, wherein the soft magnetic layer includes an amorphous structure.

In one embodiment of the invention, the at least one hard magnetic layer is a pair of hard magnetic layers respectively arranged on both sides of the soft magnetic layer, and wherein the at least one non-magnetic layer is a pair of non-magnetic layers formed between the soft magnetic layer and the pair of hard magnetic layers.

Preferably, the hard magnetic layer has a ratio of remanent magnetization to saturation magnetization is about 0.7 or more.

In another embodiment of the invention, the hard magnetic layer is partially or entirely formed of oxide. The hard magnetic layer may be formed of an oxide of Co or an oxide of Fe.

In still another embodiment of the invention, the hard magnetic layer contains $Co_xFe_{1-x}$ as a main component, where x is in a range of about 0.3 to about 0.7.

In still another embodiment of the invention, the magnetoresistive device further includes an oxide layer formed on a side of the hard magnetic layer opposite to a side on which the non-magnetic layer is formed. The oxide layer may be formed of an oxide of Ni.

In still another embodiment of the invention, the magnetoresistive device further includes an oxide magnetic layer formed on a side of the hard magnetic layer opposite to a side on which the non-magnetic layer is formed. The oxide magnetic layer may be formed of an oxide of Co or an oxide of Fe.

In still another embodiment of the invention, the magnetoresistive device further includes a further interface magnetic layer provided at an interface between the hard magnetic layer and the non-magnetic layer. Preferably, the further interface magnetic layer mainly contains Co or Co—Fe alloy and has a thickness of about 2 nm or less.

According to another aspect of the present invention, a magnetoresistive device includes: at least one metal antiferromagnetic layer; at least one magnetic layer which is magnetically coupled with the at least one metal antiferromagnetic layer; a soft magnetic layer; at least one non-magnetic layer formed between the at least one magnetic layer and the soft magnetic layer; and an interface magnetic layer, provided at an interface between the soft magnetic layer and the at least one non-magnetic layer, for enhancing magnetic scattering, wherein the soft magnetic layer includes an amorphous structure.

In one embodiment of the invention, the at least one metal antiferromagnetic layer is a pair of metal antiferromagnetic layers respectively arranged on both sides of the soft magnetic layer, and wherein the at least one magnetic layer magnetically coupled with the at least one metal antiferromagnetic layers is a pair of magnetic layers arranged on both sides of the soft magnetic layer.

According to still another aspect of the present invention, a magnetoresistive device includes: at least two soft magnetic layers; at least one non-magnetic layer formed between the soft magnetic layers; at least one metal antiferromagnetic layer formed on a side of one of the soft magnetic layers opposite to a side on which the at least one non-magnetic layer is formed; and an interface magnetic layer, provided at at least one interface between the at least one non-magnetic layer and the soft magnetic layers, for enhancing magnetic scattering, wherein at least one of the soft magnetic layers includes an amorphous structure.

In one embodiment of the invention, the at least two soft layers are three soft layers; the at least one non-magnetic layer is a pair of non-magnetic layers which are interposed between adjacent two of the three soft layers, respectively; and the at least one metal antiferromagnetic layer is a pair of metal antiferromagnetic layers arranged to sandwich the three soft magnetic layers and the pair of non-magnetic layers therebetween.

In another embodiment of the invention, the magnetoresistive device further includes a crystalline magnetic layer formed between the metal antiferromagnetic layer and the soft magnetic layer. The crystalline magnetic layer may be formed of Ni—Fe—Co alloy.

The metal antiferromagnetic layer may be formed of M—Mn alloy, where M is selected one of Ir, Pt, Pd and Ni. Preferably, the metal antiferromagnetic layer is formed of Ir—Mn alloy. Alternatively, the metal antiferromagnetic layer may be formed of Fe—Ir alloy.

In each of the above-described magnetoresistive devices, the interface magnetic layer may mainly contain Co or Co—Fe alloy, and have a thickness of about 2 nm or less.

In each of the above-described magnetoresistive devices, the non-magnetic layer may include a non-magnetic layer of a different material inserted therein. Preferably, the non-magnetic layer of the different material has a thickness of about 1 nm or less.

In each of the above-described magnetoresistive devices, the soft magnetic layer may mainly contain Co—Mn—B alloy. Alternatively, the soft magnetic layer may mainly contain Co—Nb—Zr alloy. Alternatively, the soft magnetic layer may mainly contain Co—Nb—B alloy.

In each of the above-described magnetoresistive devices, magnetization easy axis of the hard magnetic layer, the magnetic layer which is magnetically coupled with the metal antiferromagnetic layer, or the magnetic layer which is in contact with the metal antiferromagnetic layer substantially coincides with a direction of a magnetic field to be detected, and the magnetoresistive device has a thickness of about 20 nm or less.

According to still another aspect of the invention, a magnetoresistive head includes any one of the above-described magnetoresistive devices and a lead portion.

Thus, the invention described herein makes possible the advantage of providing a magnetoresistive device which can simultaneously improve both an MR ratio and a magnetic field sensitivity and a magnetoresistive head using such a magnetoresistive device.

This and other advantages of the present invention will become apparent to those skilled in the art upon reading and understanding the following detailed description with reference to the accompanying figures.

DESCRIPTION OF THE PREFERRED EMBODIMENTS

Hereinafter, the MR device and the MR head according to the present invention will be described with reference to the accompanying drawings.

(Embodiment 1)

Figure 1:
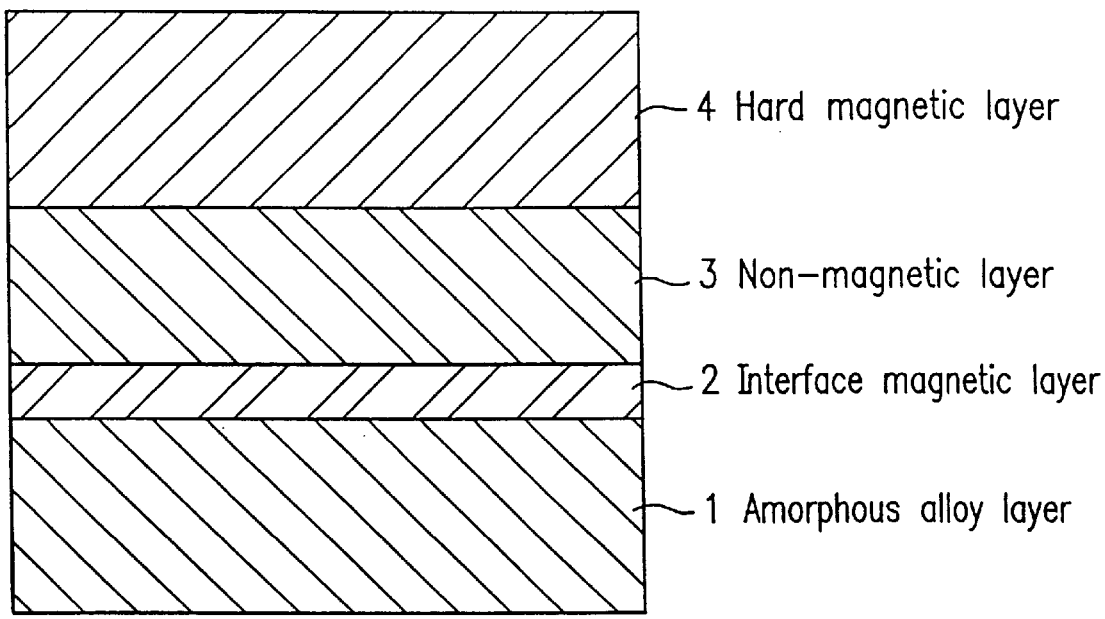
FIG. 1 is a cross-sectional view schematically showing an embodiment of the magnetoresistive device of the present invention.

FIG. 1 schematically shows the cross section of an exemplary embodiment of the MR device of the present invention. In the MR device shown in FIG. 1, an amorphous alloy layer 1 as a soft magnetic layer, a hard magnetic layer 4 and a non-magnetic layer 3 sandwiched therebetween. The non-magnetic layer 3 is provided for weakening magnetic coupling between the hard magnetic layer 4 and the amorphous alloy layer 1. The MR device of the present embodiment further includes another magnetic layer 2 inserted into the interface between the non-magnetic layer 3 and the amorphous alloy layer 1. The magnetic layer 2 is provided for enhancing spin-dependent scattering of the conduction electrons occurring at the interface of the layers 1 and 3. The magnetization of the amorphous alloy layer 1 as the soft magnetic layer can be rotated (inverted) by application of a relatively weak magnetic field, whereas the magnetization of the hard magnetic layer 4 is not rotated. Thus, when a magnetic field to be detected as a signal is applied to the MR device, only the magnetization of the amorphous alloy layer 1 is rotated in accordance with the applied magnetic field, resulting in change in angle between magnetization directions of the amorphous alloy layer 1 and the hard magnetic layer 4. As a result, an electric resistance of the MR device is changed.

In this specification, a magnetic layer having a coercive force of 100 Oe or more is referred to as "a hard magnetic layer", and a magnetic layer having a coercive force of 20 Oe or less is referred to as "a soft magnetic layer". In addition, a magnetic layer having a coercive force which is larger than that of the soft magnetic layer and is smaller than that of the hard magnetic layer is referred to as "a semi-hard magnetic layer".

The operation principle of the MR device of the present invention will be described below. In the case where the hard magnetic layer 4 is unidirectionally magnetized by a ferro-magnetic field, when a weak signal magnetic field having a direction opposite to the direction in which the hard magnetic layer 4 is magnetized is applied to the MR device, the magnetization of the hard magnetic layer 4 is not rotated, but the magnetization of the amorphous alloy layer 1 as the soft magnetic layer is rotated to the direction of the magnetic field. As a result, the magnetization direction of the hard magnetic layer 4 is anti-parallel to the magnetization direction of the amorphous alloy layer 1. When the magnetization direction of the hard magnetic layer is anti-parallel to that of the amorphous alloy layer 1, the conduction electrons in the MR device is subjected to magnetic scattering, mainly at interfaces between the hard magnetic layer 4 and the non-magnetic layer 3 and between the non-magnetic layer 3 and the interface magnetic layer 2. As a result, the electric resistance of the MR device increases.

On the other hand, when a weak magnetic field having the same direction as the direction in which the hard magnetic layer 4 is magnetized is applied to the MR device, the magnetization direction of the hard magnetic layer 4 is parallel to that of the amorphous alloy layer 1. As a result, the above-mentioned magnetic scattering is reduced so that the electric resistance of the MR device is reduced. On the basis of the above-mentioned principle, the MR device varies its electric resistance depending on the change in the signal magnetic field.

In a conventional spin-valve type MR device, since a crystalline Ni—Fe alloy or Ni—Fe—Co alloy layer is used as a soft magnetic layer, the magnetic field required for inverting the magnetization of the soft magnetic layer, i.e., the operating magnetic field cannot be sufficiently weakened. However, according to the present invention, an amorphous alloy layer is used as a soft magnetic layer. Since the magnetocrystalline anisotropy of an amorphous alloy layer is smaller than that of a crystalline alloy layer, the coercive force thereof can be sufficiently weakened, thereby weakening the operating magnetic field. In the case of using a layer which is perfectly in an amorphous state, the magnetocrystalline anisotropy thereof is zero, and thus, the coercive force thereof can be greatly weakened. In this specification, a term "an amorphous layer" indicates a layer including an amorphous structure, but is not limited to a layer which is perfectly in an amorphous state. In view of the application to a magnetic head or the like, the thickness of an amorphous alloy layer of the present invention is preferably 10 nm or less, more preferably 5 nm or less. However, it is difficult to confirm whether or not such a thin layer is totally amorphous by an X-ray diffraction or the like. Thus, if a layer as thick as about 100 nm is fabricated, then the amorphous structure of the layer can be easily confirmed.

The amorphous alloy materials usable for the amorphous alloy layer 1 include: Co—M—B (where M=Mn, Fe) materials including boron (B) by about 15–30 atomic percent; Co—T materials (where T=Nb, Ta, Zr, Hf) including non-magnetic transition metals T by about 6 to 25 atomic percent; and Co(—M)—T—B materials which are intermediate between the above-cited two types of materials and include B, T and M by about 2–15 atomic percent, 2–20 atomic percent and about 5 atomic percent, respectively (in this case, M is added for adjusting the magnetostriction). The materials mainly composed of Co—Mn—B are particularly suitable for attaining a large MR ratio. The materials mainly composed of Co—Nb—Zr are particularly suitable with respect to corrosion resistance and soft magnetic characteristics. And the materials mainly composed of Co—Nb—B exhibit intermediate balanced characteristics between the Co—Mn—B materials and the Co—Nb—Zr materials.

The Co—Mn—B materials are preferably composed so as to have a composition ratio where the magnetostriction thereof becomes substantially zero (absolute value of the magnetostriction becomes $10^{-5}$ or less). Thus, the atomic composition ratio of the Co—Mn—B materials is preferably represented by:

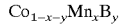
$Co_{1-x-y}Mn_xB_y$ (where $0.05 \leq x \leq 0.08$ and $0.15 \leq y \leq 0.3$).

In the case of the Co—Fe—B materials, the atomic composition ratio thereof is preferably represented by:

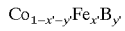
$Co_{1-x'-y'}Fe_{x'}B_{y'}$ (where $0.05 \leq x' \leq 0.06$ and $0.15 \leq y' 0.3$).

In the case of the Co—Nb—Zr materials, the atomic composition ratio thereof is preferably represented by:

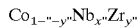
$Co_{1-x''-y''}Nb_{x''}Zr_{y''}$ (where $0.06 \leq x'' \leq 0.20$ and $0.03 \leq y'' \leq 0.10$).

And in the case of the Co—Nb—B materials, the atomic composition ratio thereof is preferably represented by:

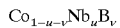
$Co_{1-u-v}Nb_uB_v$ (where $0.02 \leq u \leq 0.15$ and $0.02 \leq v \leq 0.20$). However, the magnetostriction of the Co—Nb—B materials is slightly lower than zero. Thus, in order to adjust the magnetostriction thereof to be zero, Fe or Mn is preferably added thereto by the atomic composition ratio of about 1 to 5 percent.

In the foregoing description, the compositions of alloys, which can provide Co—Mn—B, Co—Fe—B, Co—Nb—Zr and Co—Nb—B alloys which are perfectly in an amorphous state, are described. However, the soft magnetic layer of the present invention is not always required to be perfectly amorphous. Alternatively, the soft magnetic layer may have a small amount of crystalline material or may include a microcrystalline structure. In this case, the MR ratio is certainly improved but the soft magnetic characteristics thereof tend to deteriorate to a certain degree. A specific atomic composition ratio applicable to $Co_{1-x-y}Mn_xB_y$ with a crystalline material mixed may be represented by:

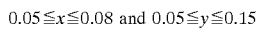
$0.05 \leq x \leq 0.08$ and $0.05 \leq y \leq 0.15$

On the other hand, a specific atomic composition ratio applicable to $Co_{1-x'-y'}Fe_{x'}B_{y'}$ with a crystalline material mixed may be represented by:

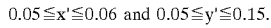
$0.05 \leq x' \leq 0.06$ and $0.05 \leq y' \leq 0.15$.

The hard magnetic layer 4 is preferably made of a ferromagnetic material which exhibits a magnetization curve having a good square feature. In this specification, a "good square feature" is defined so that the square ratio S (=remanent magnetization/saturation magnetization) is about 0.7 or more. It is more preferable that a ferromagnetic material exhibiting the square ratio of about 0.85 or more is used as the hard magnetic layer 4. If the square ratio of the hard magnetic layer 4 is unsatisfactory, then a perfectly parallel alignment of the magnetizations or a perfectly antiparallel alignment of the magnetizations state cannot be established between the hard magnetic layer 4 and a soft magnetic layer (the amorphous alloy layer 1 in the MR device of the present invention), resulting in poor linearity and small MR ratio.

Materials mainly composed of Co (over 50 atomic %) is preferable for obtaining a large MR ratio. Among such materials, Co, Co—Fe alloys and Co—Pt alloys exhibit excellent characteristics as materials for the hard magnetic layer. Co and Co—Fe alloys are particularly preferable. More preferably, Co—Fe alloys having the following atomic composition ratio

$Co_{1-x}Fe_x$ (where $0.3 \leq x \leq 0.7$) is used.

In the foregoing description, the hard magnetic layer 4 is assumed to be composed of a single layer of metal or a single layer of metal alloy. Optionally, an oxide layer or an oxide magnetic layer may be further provided on the side of the hard magnetic layer 4 opposite to the non-magnetic layer 3. By additionally providing such an oxide layer or an oxide magnetic layer, it is relatively easy to sufficiently increase the coercive force of the hard magnetic layer 4. In such a case, the square ratio of the hard magnetic layer 4 can be increased as a whole and the MR ratio thereof can be further increased. Ni—O or the like may be used as a material for the oxide layer and Co—O, Fe—O, Co—Fe—O or the like may be used as a material for the oxide magnetic layer.

Alternatively, the hard magnetic layer 4 may be totally replaced by an oxide magnetic layer. In such a case, Co—O, Fe—O, Co—Fe—O or the like may also be used as a material for the oxide magnetic layer.

The non-magnetic layer 3 is formed in order to weaken magnetic coupling between the hard magnetic layer 4 and the amorphous alloy layer 1 as the soft magnetic layer. Thus, a material for the non-magnetic layer 3 and the thickness thereof are selected considering this purpose. Specifically, Cu, Ag, Au, Ru or the like may be used as a material for the non-magnetic layer 3 between the hard magnetic layer 4 and a soft magnetic layer (the amorphous alloy layer 1). Among these materials, Cu is most suitably used. In order to weaken the interaction between the two magnetic layers 4 and 1, the thickness of the non-magnetic layer 3 is required to be at least about 1.5 nm or more, desirably about 1.8 nm or more. On the other hand, if the non-magnetic layer 3 becomes too thick, then the MR ratio thereof is adversely decreased. Thus, the thickness of the non-magnetic layer 3 should be about 10 nm or less, desirably about 3 nm or less.

In addition, it is also effective to insert another non-magnetic layer which is formed of a different material from that of the non-magnetic layer 3 into the non-magnetic layer 3 for reducing the magnetic coupling between the hard magnetic layer 4 and the soft magnetic layer (the amorphous alloy layer 1). In other words, the non-magnetic layer 3 can be composed of a plurality of non-magnetic layers formed of different materials. For example, instead of forming a single-layer non-magnetic layer of Cu, the non-magnetic layer may have a multilayer structure such as Cu/Ag/Cu, Cu/Ag and Ag/Cu/Ag. The non-magnetic layer to be inserted is preferably made of Ag, Au or the like. In this case, the thickness of the multilayer non-magnetic layer is desirably approximately equal to that of the single-layer non-magnetic layer. The thickness of a non-magnetic layer to be inserted into the non-magnetic layer 3 is at most about 1 nm, desirably about 0.4 nm or less.

Figure 12:
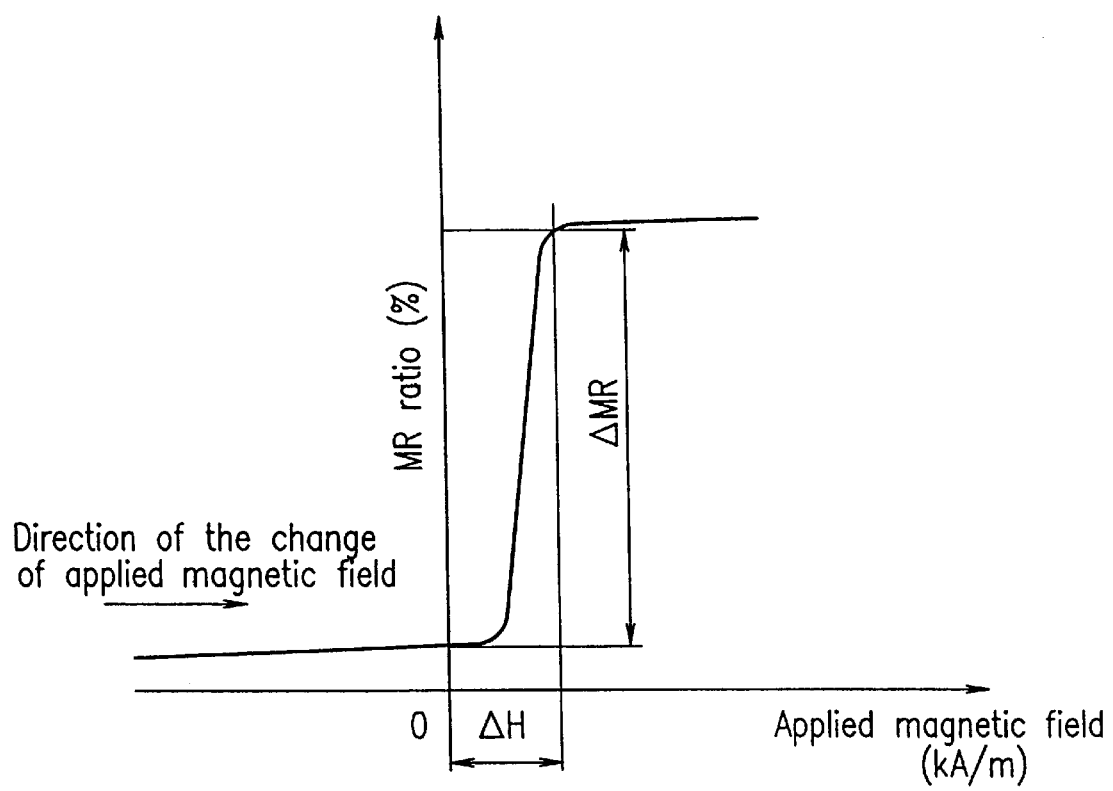
FIG. 12 is a diagram illustrating the definition of the MR sensitivity $\Delta MR/\Delta H$.

Next, the interface magnetic layer 2 inserted into the interface between the non-magnetic layer 3 and the amorphous alloy layer 1 as the soft magnetic layer will be described below. As described above, the inserted interface magnetic layer 2 enhances a spin-dependent scattering of the conduction electrons, thereby increasing the MR ratio. In addition, when the thickness of the interface magnetic layer 2 is set to be an adequate thickness, an MR sensitivity ($\Delta MR/\Delta H$) is also improved. In this case, $\Delta MR/\Delta H$ is defined as a change in MR ratio with respect to a change in applied magnetic field from the zero magnetic field, as shown in FIG. 12. The interface magnetic layer 2 improves the MR sensitivity $\Delta MR/\Delta H$ as well as the MR ratio, presumably because the interface magnetic layer 2 increases the magnetic scattering in the interface between a magnetic layer and a non-magnetic layer. In addition, an interface magnetic layer 2 having a small thickness presumably has an effect of improving the soft magnetic characteristics of the amorphous alloy layer 1. However, if the interface magnetic layer 2 is too thick, then the soft magnetic characteristics of the soft magnetic layer are degraded as a whole and a magnetic field sensitivity of the MR ratio is deteriorated. Thus, in order to avoid the deterioration of the soft magnetic characteristics of the amorphous alloy layer 1, the thickness of the interface magnetic layer 2 is preferably set to about 2 nm or less, more preferably about 1.8 nm or less. On the other hand, in order to make the interface magnetic layer 2 function effectively, the thickness thereof is required to be at least 0.2 nm, desirably 0.8 nm or more.

A material for the interface magnetic layer 2 is selected so that it enhances the spin-dependent scattering of the conduction electrons, and that the combination of the interface magnetic layer 2 and the soft magnetic layer (the amorphous alloy layer) 1 serves as a soft magnetic layer. Specifically, materials mainly composed of Co (over 50 atomic %) is suitable for the material of the interface magnetic layer 2 of the present invention, more preferably Co or a Co—rich Co—Fe alloy.

In the foregoing description, an interface magnetic layer is assumed to be inserted between the non-magnetic layer 3 and. the amorphous alloy layer 1. Optionally, another interface magnetic layer may be inserted between the non-magnetic layer 3 and the hard magnetic layer 4. In this case, magnetic scattering within the MR device is enhanced, thereby greatly increasing the MR ratio. As well as the interface magnetic layer 2 interposed between the non-magnetic layer 3 and the amorphous alloy layer 1, a material for the additional interface magnetic layer to be inserted between the non-magnetic layer 3 and the hard magnetic layer 4 and the thickness thereof are selected so as to deteriorate the magnetic characteristics (e.g., coercive force and square ratio of the magnetic curve) of the hard magnetic layer 4. Specifically, if the thickness of the additional interface magnetic layer is about 2 nm or less, the MR ratio can be increased substantially without varying the characteristics of the hard magnetic layer 4. In particular, in the case of incorporating the MR device of the present embodiment in an magnetic head or the like, it is preferable to set the thickness of the additional interface magnetic layer between the hard magnetic layer 4 and the non-magnetic layer 3 to be 1 nm or less.

The structure shown in FIG. 1 is a basic structure of the MR device of the present embodiment including a hard magnetic layer 4, a non-magnetic layer 3, an interface magnetic layer 2 and an amorphous alloy layer 1 in descending order. Alternatively, in order to further increase the MR ratio, a structure shown in FIG. 2 including a hard magnetic layer 4, a non-magnetic layer 3, an interface magnetic layer 2, an amorphous alloy layer 1, an interface magnetic layer 2, a non-magnetic layer 3 and a hard magnetic layer 4 in descending order may also be used. A giant magnetoresistance (GMR) effect has conventionally been explained as resulting from spin-dependent scattering of the conduction electrons occurring at the interface between a magnetic layer and a non-magnetic layer (for example, Physical Review B, vol. 42, pp. 8110–8120). Thus, if the number of layers to be stacked is so increased that the total thickness of the multilayer structure is approximately comparable to the mean free path of the electrons, then the magnetic scattering is enhanced, thereby increasing the MR ratio.

Figure 2:
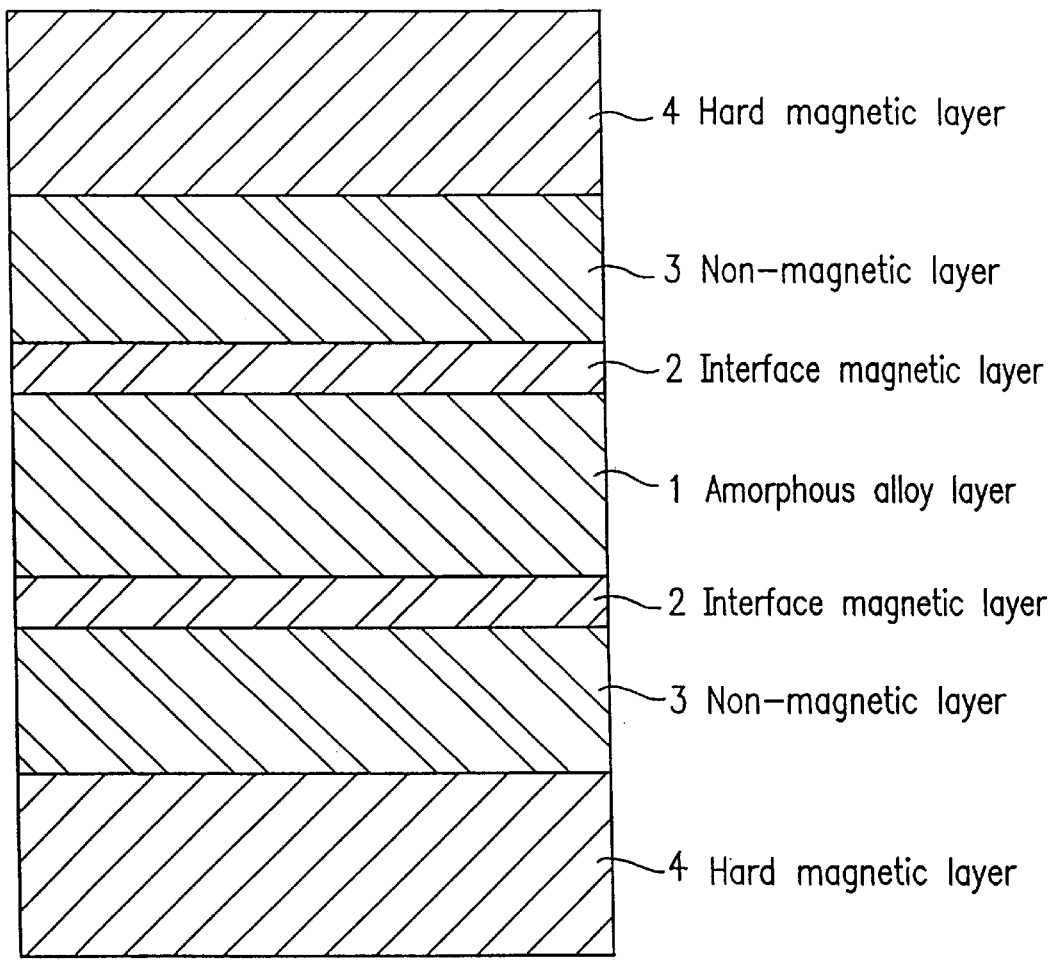
FIG. 2 is a cross-sectional view schematically showing another embodiment of the magnetoresistive device of the present invention.

The conditions, such as the materials and the thicknesses for the respective layers shown in FIG. 2 are totally the same as those described for the layers shown in FIG. 1.

(Embodiment 2)

In Embodiment 1, the present invention has been applied to a spin-valve type MR device including a hard magnetic layer. Alternatively, the present invention is effectively applicable to a spin-valve type MR device including a combination of a magnetic layer 5, which is arranged in contact with the non-magnetic layer 3, and a metal antiferromagnetic layer 6 having a function of unidirectionally magnetizing the magnetic layer 5 by directly exerting an exchange coupling interaction on the magnetic layer 5, in place of a hard magnetic layer.

Figure 3:
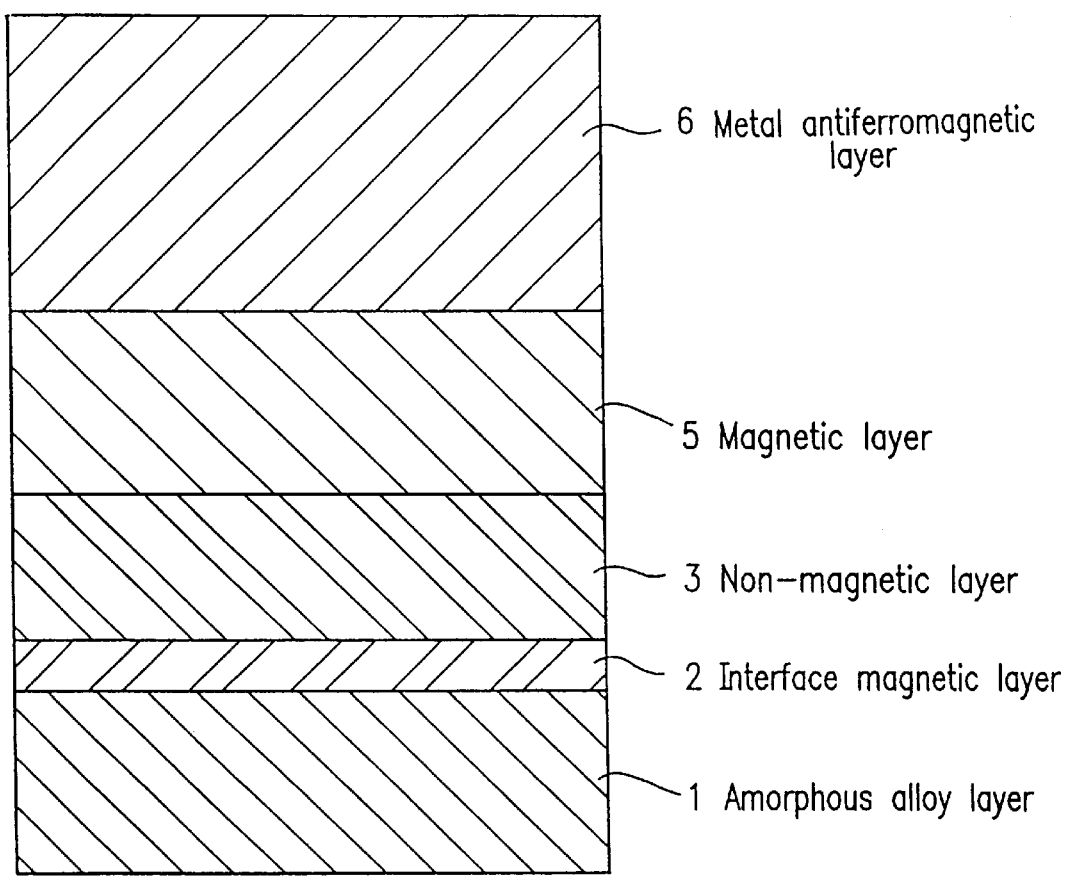
FIG. 3 is a cross-sectional view schematically showing still another embodiment of the magneto-resistive device of the present invention.

FIG. 3 shows a cross section of an MR device of the present embodiment in which an amorphous alloy layer 1 as a soft magnetic layer is provided on one side of a non-magnetic layer 3 and a magnetic layer 5 is provided on the other side of the non-magnetic layer 3. A metal antiferromagnetic layer 6 is provided on the side of the magnetic layer 5 which is opposite to the side on which the non-magnetic layer 3 is located. Furthermore, an interface magnetic layer 2 is provided between the amorphous alloy layer 1 and the non-magnetic layer 3, as in Embodiment 1.

Fe—Mn, Ni—Mn, Pd—mn, Pt—Mn, Ir—Mn, Fe—Ir and the like may be used as the materials for the metal antiferromagnetic layer 6. Among these materials, Fe—Mn has been used most frequently in a conventional spin-valve film. However, this material causes some problems in practical use in view of the corrosion resistance and the like of the material. In respect of the corrosion resistance, materials such as Ir—Mn are particularly preferable. The appropriate atomic composition ratio of an $Ir_zMn_{1-z}$ is: $0.1 \leq z \leq 0.5$. If oxides such as Ni—O, Co—O and Ni—O/Co—O are not appropriate for the materials for the antiferromagnetic layer 6, then the thickness of the antiferromagnetic layer 6 is required to be large for attaining excellent magnetic characteristics. However, in order to shorten the recording wavelength of a magneto-resistance effect device for preparing for the super high-density recording to be developed in the near future, the total thickness of an MR device is required to be reduced. Thus, such oxides are not suitable as the materials for the antiferromagnetic layer 6.

Co, Ni—Fe, Ni—Fe—Co and the like are desirable as the materials for the magnetic layer 5. The conditions, such as the materials and the thicknesses, for the other layers shown in FIG. 3 (i.e., the amorphous alloy layer 1, the interface magnetic layer 2 and the non-magnetic layer 3) are totally the same as those described for the corresponding layers shown in FIG. 1.

Figure 4:
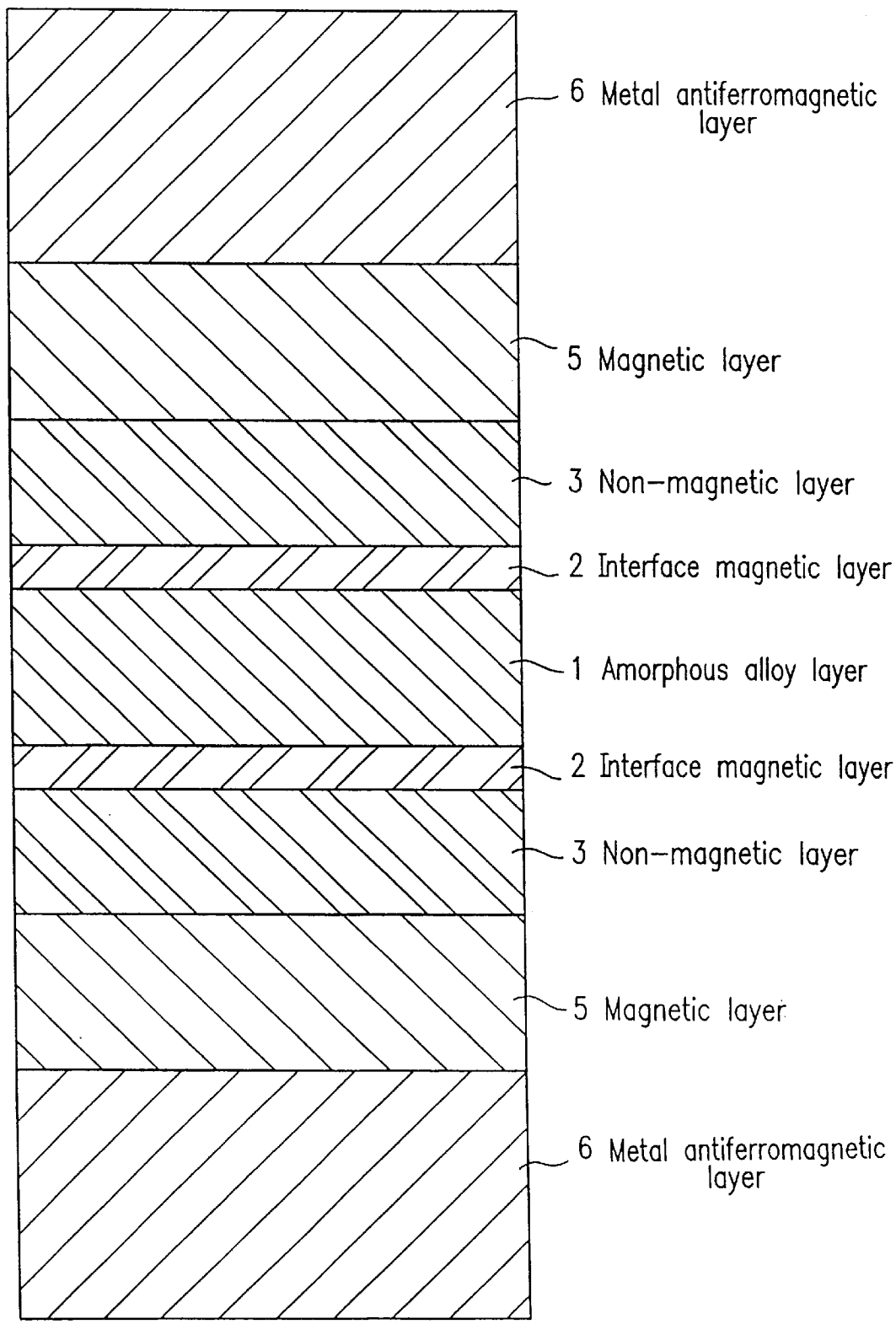
FIG. 4 is a cross-sectional view schematically showing still another embodiment of the magneto-resistive device of the present invention.

Furthermore, the MR device of the present embodiment may have a structure including a metal antiferromagnetic layer 6, a magnetic layer 5, a non-magnetic layer 3, an interface magnetic layer 2, an amorphous alloy layer 1, an interface magnetic layer 2, a non-magnetic layer 3, a magnetic layer 5 and a metal antiferromagnetic layer 6 in descending order, as shown in FIG. 4. In this case, since the number of interfaces between magnetic layers and non-magnetic layers is increased, the MR ratio is also increased.

The conditions for the respective layers shown in FIG. 4 are the same as those described for the layers shown in FIG. 3.

(Embodiment 3)

Figure 5:
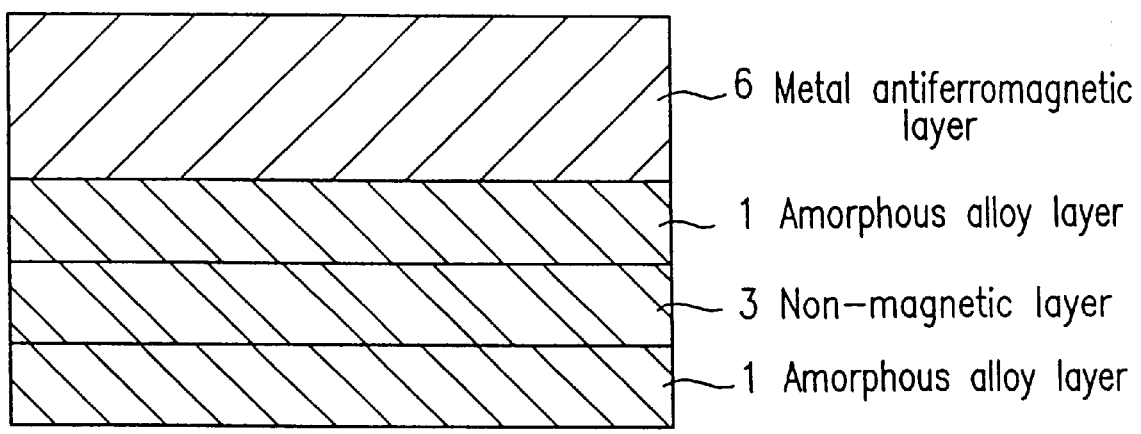
FIG. 5 is a cross-sectional view schematically showing still another embodiment of the magnetoresistive device of the present invention.

The MR device according to the third embodiment of the present invention is illustrated in FIG. 5. In the present embodiment, a pair of amorphous alloy layers 1 are formed as soft magnetic layers sandwiching a non-magnetic layer 3 therebetween, and a metal antiferromagnetic layer 6 is further formed in contact with the upper one of the pair of amorphous alloy layers 1.

Referring to FIG. 5, the amorphous alloy layer 1 in contact with the metal antiferromagnetic layer 6 is generally called a "pinned layer". The magnetization direction of the amorphous alloy layer 1 as the pinned layer is fixed to be unidirectional by the exchange coupling interaction which has been directly applied from the metal antiferromagnetic layer 6. On the other hand, the amorphous alloy layer 1 not in contact with the metal antiferromagnetic layer 6 is called a "free layer". The magnetization direction of the amorphous alloy layer 1 as the free layer can be freely rotated. There is a difference in magnetoresistance of the MR device between when the magnetization directions of the pinned layer and the free layers are parallel and when the magnetization directions are antiparallel. The operation of such an MR device utilizes a change in the magnetoresistance generated by inverting the magnetization direction of the free layer in accordance with the applied magnetic field while fixing the magnetization direction of the pinned layer.

The conditions (materials, thicknesses and the like) for the respective layers shown in FIG. 5, i.e, the amorphous alloy layers 1, the non-magnetic layer 3 and the metal antiferromagnetic layer 6 are the same as those described for the layers shown in FIG. 3.

FIG. 5 shows a case where the metal antiferromagnetic layer 6 is in contact with one of the amorphous alloy layers 1. Optionally, a crystalline magnetic layer may be inserted between the metal antiferromagnetic layer 6 and the amorphous alloy layer 1. Since the metal antiferromagnetic layer 6 is generally crystalline, if the soft magnetic layer (i.e., the upper amorphous alloy layer 1) functioning as the pinned layer is also crystalline, then the biasing magnetic field causing an exchange coupling interaction which has been applied from the metal antiferromagnetic layer 6 is increased, so that a force fixing the magnetization direction is strengthened. Thus, if a crystalline magnetic layer is inserted between the metal antiferromagnetic layer 6 and the amorphous alloy layer 1, then the magnetization direction of the pinned layer can be further stabilized. Ni—Fe—Co alloys, Ni—Fe alloys, Co and the like are desirable as the materials for the crystalline magnetic layer. If the thickness of the crystalline magnetic layer is about 0.4 nm or less, then satisfactory effects cannot be attained. Thus, the thickness of the crystalline magnetic layer is preferably about 1 nm or more. Nevertheless, if the thickness is too large, then the MR ratio is adversely decreased. Consequently, the thickness of the crystalline magnetic layer is preferably about 5 nm or less, more preferably about 2 nm or less.

Figure 7:
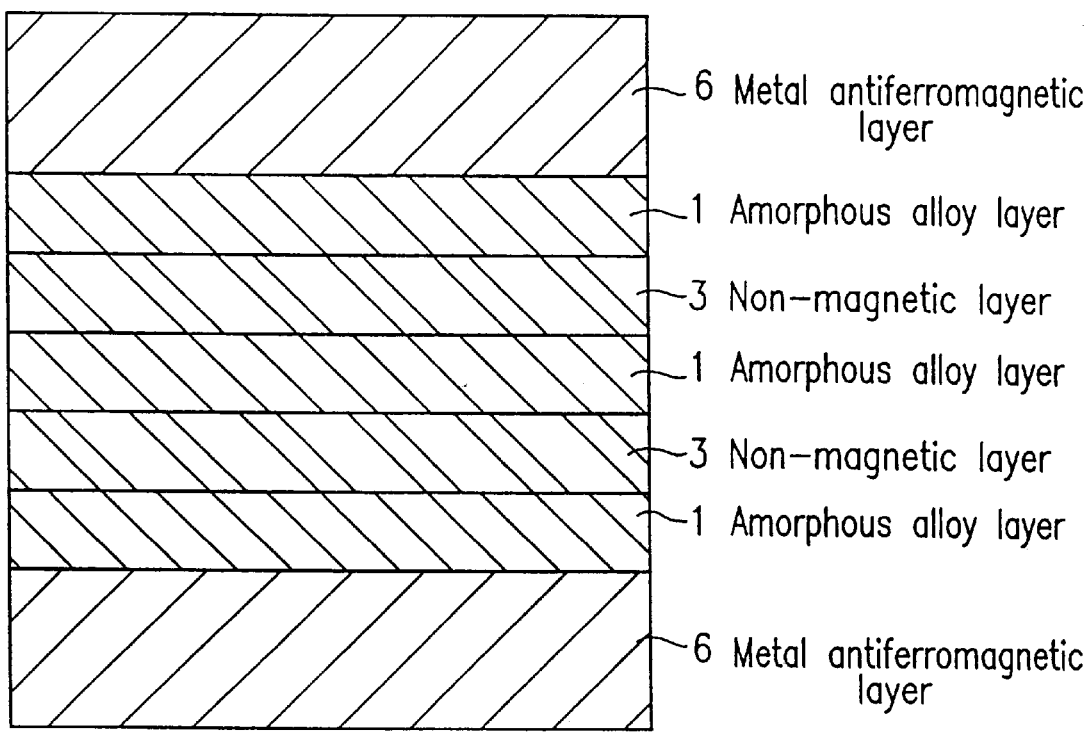
FIG. 7 is a cross-sectional view schematically showing still another embodiment of the magneto-resistive device of the present invention.

The structure shown in FIG. 5 is a basic structure of the MR device of the present embodiment including an amorphous alloy layer 1, a non-magnetic layer 3, another amorphous alloy layer 1 and a metal antiferromagnetic layer 6 in ascending order. Alternatively, in order to further increase the MR ratio, a structure shown in FIG. 7 including a metal antiferromagnetic layer 6, an amorphous alloy layer 1, a non-magnetic layer 3, an amorphous alloy layer 1, a non-magnetic layer 3, an amorphous alloy layer 1, and a metal antiferromagnetic layer 6 in descending order may also be used. A giant magnetoresistance effect has conventionally been explained as resulting from the spin-dependent scattering of the conduction electrons occurring at the interface between a magnetic layer and a non-magnetic layer. Thus, if the number of layers to be stacked is so increased that the total thickness of the multilayer structure is approximately comparable to the mean free path of the electrons, then the MR ratio can be increased The conditions for the respective layers shown in FIG. 7 are the same as those described for the layers shown in FIG. 5.

(Embodiment 4)

Figure 6A:
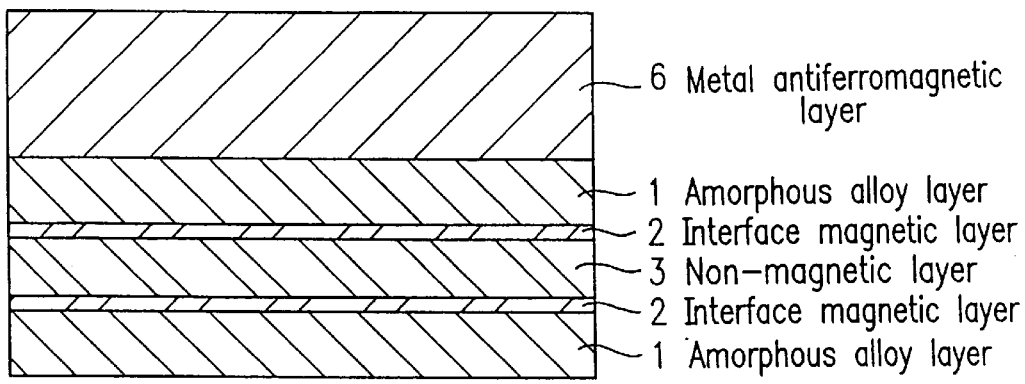
FIGS. 6A, 6B and 6C are cross-sectional views schematically showing still other embodiments of the magnetoresistive device of the present invention.
Figure 6B:
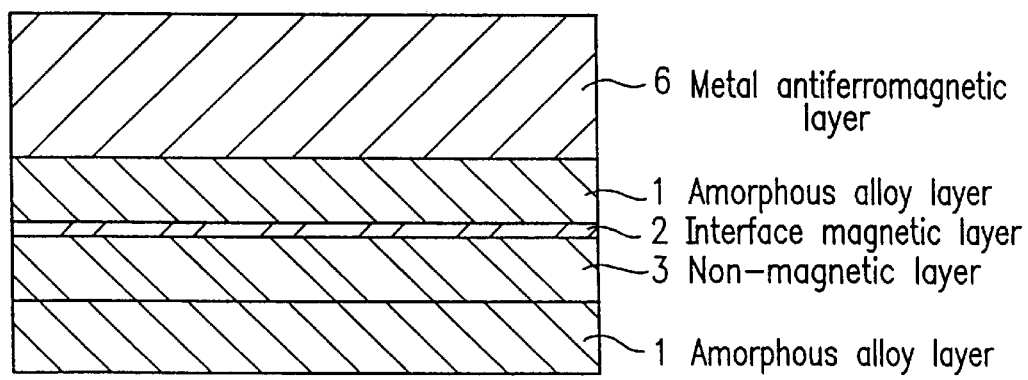
Figure 6C:
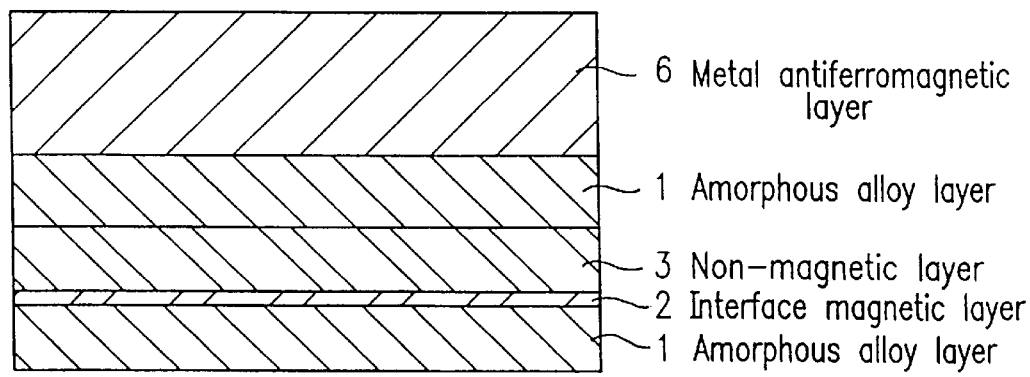
Figure 8:
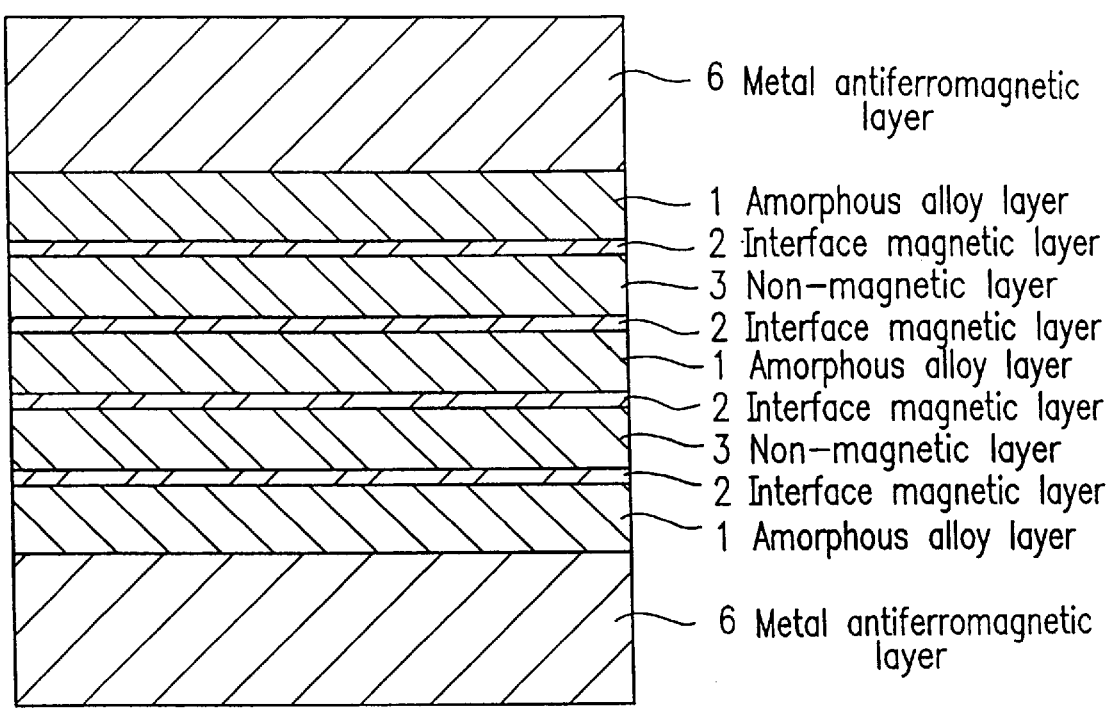
FIG. 8 is a cross-sectional view schematically showing still another embodiment of the magneto-resistive device of the present invention.

Next, an MR device according to the fourth embodiment of the present invention will be described with reference to FIGS. 6A, 6B and 6C and 8. FIGS. 6A to 6C show exemplary cross sections of the MR device of the present embodiment, and FIG. 8 shows a cross section of an MR device according to a modification of the present embodiment. As shown in these figures, in the MR device of the present embodiment and the modification, an interface magnetic layer 2 is inserted into at least one interface between a non-magnetic layer 3 and an amorphous alloy layer 1. In order to attain a sufficient effect, a pair of interface magnetic layers 2 are inserted on both sides of the non-magnetic layer 3 as shown in FIG. 6A. However, even when only one interface magnetic layer 2 is inserted on either side of the non-magnetic layer 3 as shown in FIGS. 6B and 6C, effects can be still attained. The interface magnetic layer 2 increases not only the MR ratio but also the MR sensitivity ($\Delta MR/\Delta H$) shown in FIG. 12.

In Embodiments 1–4, each of the amorphous alloy layer 1 as the soft magnetic layer, the interface magnetic layer 2, the non-magnetic layer 3, the hard magnetic layer 4, the magnetic layer 5, and the metal antiferromagnetic layer 6 may be formed by a sputtering method or an evaporation method. In either case, the MR device of the present invention can be fabricated. However, it should be noted that a sputtering method is particularly suitable for fabricating an amorphous alloy layer 1. Various sputtering techniques including DC sputtering, RF sputtering and ion beam sputtering may be applicable. In any of these techniques, the magneto-resistance effect device of the present invention can be fabricated. On the other hand, in the case of using an evaporation method, a super high vacuum evaporation technique is particularly preferable.

The MR devices described in Embodiments 1–4 are actually fabricated on a substrate, such as a glass substrate. In fabrication of these MR devices, layers constituting the MR devices are formed on the substrate either in the order of lowermost layer to uppermost layer (for example, the amorphous alloy layer 1, the interface magnetic layer 2, non-magnetic layer 3 and the hard magnetic layer 4 in the MR device as shown in FIG. 1) or in the inverse order of the uppermost layer to the lower-most layer. Moreover, the MR devices as described in Embodiments 1–4 may be formed directly on the substrate. Alternatively, an underlying layer formed of, for example, Ta, Cr, Fe, Cu, Ag, Ru or the like, may be formed on the substrate before fabricating the MR devices, and then the MR devices may be formed on the underlying layer.

Figure 9:
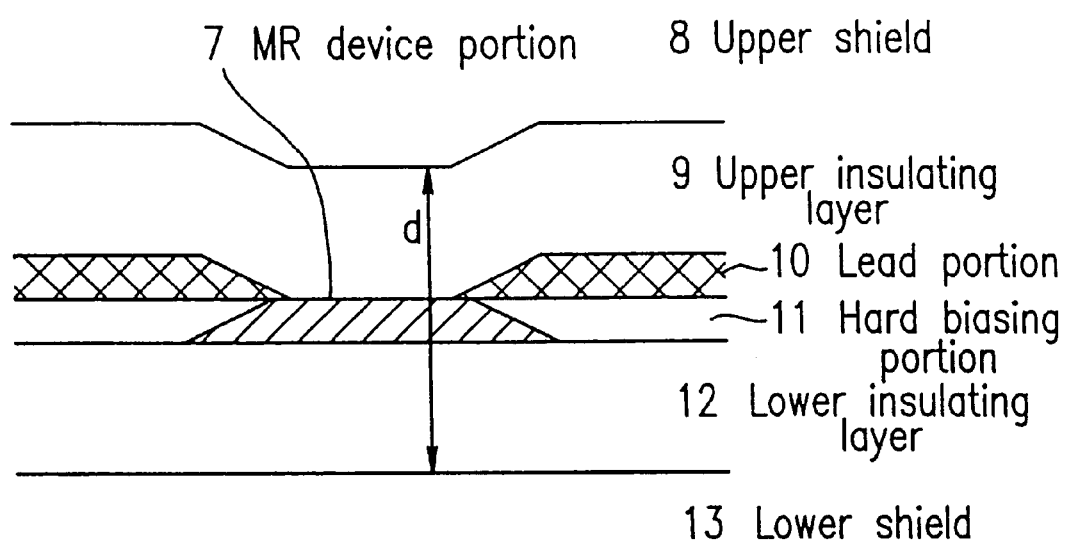
FIG. 9 is a cross-sectional view showing an exemplary magnetoresistive head of the present invention.

An magnetoresistive head (MR head) can be formed by using the above-described MR device of the present invention. An exemplary structure of an MR head of a hard layer biasing type is shown in FIG. 9. As shown in FIG. 9, an MR device 7 is formed so as to be interposed between an upper insulating layer 9 and a lower insulating layer 12. Materials such as $Al_2O_3$ and $SiO_2$ are usable for the insulating layers 9 and 12. A pair of shields 8 and 13 are further formed on the outer side of the upper insulating layer 9 and on the outer side of the lower insulating layer 12, respectively. A soft magnetic layer made of an Ni—Fe alloy or the like is used as the shields 8 and 13.

In the MR head of the present invention, a pinned layer (a hard magnetic layer 4 or a magnetic layer in contact with a metal antiferromagnetic layer 6) of the MR device 7 is magnetized so that the magnetization direction coincides with a signal magnetic field to be detected (a direction perpendicular to the sheet surface in FIG. 9), and a magnetization easy axis of a free layer (i.e., a soft magnetic layer is adjusted to be perpendicular to the signal magnetic field). Hard biasing portions 11 is formed of a Co—Pt alloy or the like in order to stabilize the magnetization direction of the soft magnetic layer (i.e., to uniaxially magnetize the soft magnetic layer) by applying a biasing magnetic field. Thus, Barkhausen noise can be prevented from occurring when the magnetization direction of the soft magnetic layer is rotated. In FIG. 9, a hard magnetic layer is assumed to be used for applying the biasing magnetic field. Alternatively, an antiferromagnetic material such as Fe—Mn may also be used. The MR device 7 is electrically insulated from the shields 8 and 13 via the insulating layers 9 and 12.

The MR head is used only for reading a signal recorded on a recording medium and is of an inductive type which reads the signal utilizing an induction. Thus, when the MR head is operated, a leakage magnetic field from the surface of the recording medium functions as a signal magnetic field. In the operation of the MR head having a structure shown in FIG. 9, the signal magnetic field is applied in a direction parallel to the magnetization difficult axis of the free layer (the soft magnetic layer) of the MR device 7, thereby the magnetization direction of the soft magnetic layer is rotated. As a result, an angle between the magnetization direction of the pinned layer, which is fixed, and the magnetization direction of the free layer is changed, resulting in change in electric resistance of the MR device 7. By supplying a current through a lead portion 10, the electric resistance change can be detected as an output voltage.

In order to realize a super high density for a hard disk drive in the near future, the recording wavelength of the MR device 7 is required to be shortened. Thus, the distance d between the shields 8 and 13 (i.e., a shield gap) is required to be reduced, which in turn requires reduction in thickness of the MR device portion 7 as is clear from FIG. 9. The thickness of the MR device portion 7 is preferably at most about 20 nm. The MR device of the present invention is suitably formed as such a thin-film device.

Hereinafter, the MR device and the MR head of the present invention will be described by way of specific examples.

EXAMPLE 1

An MR device A0 having a structure shown in FIG. 1 was formed on a substrate (for example, a glass substrate) by an RF magnetron sputtering apparatus using a ternary target $Co_{0.68}Mn_{0.06}B0.26$. The specific structure of the MR device A0 is as follows:

A0: $Co_{0.06}Mn_{0.06}B_{0.26}$ (2 nm)/Co (x nm)/Cu (2 nm)/Co (2 nm)

where the numerical values in parentheses indicate layer thicknesses and the composition ratio of Co—Mn—B is represented by the composition ratio of the target.

For comparison, a comparative MR device A1 having a similar structure except for including Ni—Fe alloy layer as a soft magnetic layer in place of a $Co_{0.68}Mn_{0.06}B0.26$ layer w as fabricated by a similar fabrication method.

A1: $Ni_{0.8}Fe_{0.2}$ (2 nm)/Co (x nm)/Cu (2 nm)/Co (2 nm)

Figure 10:
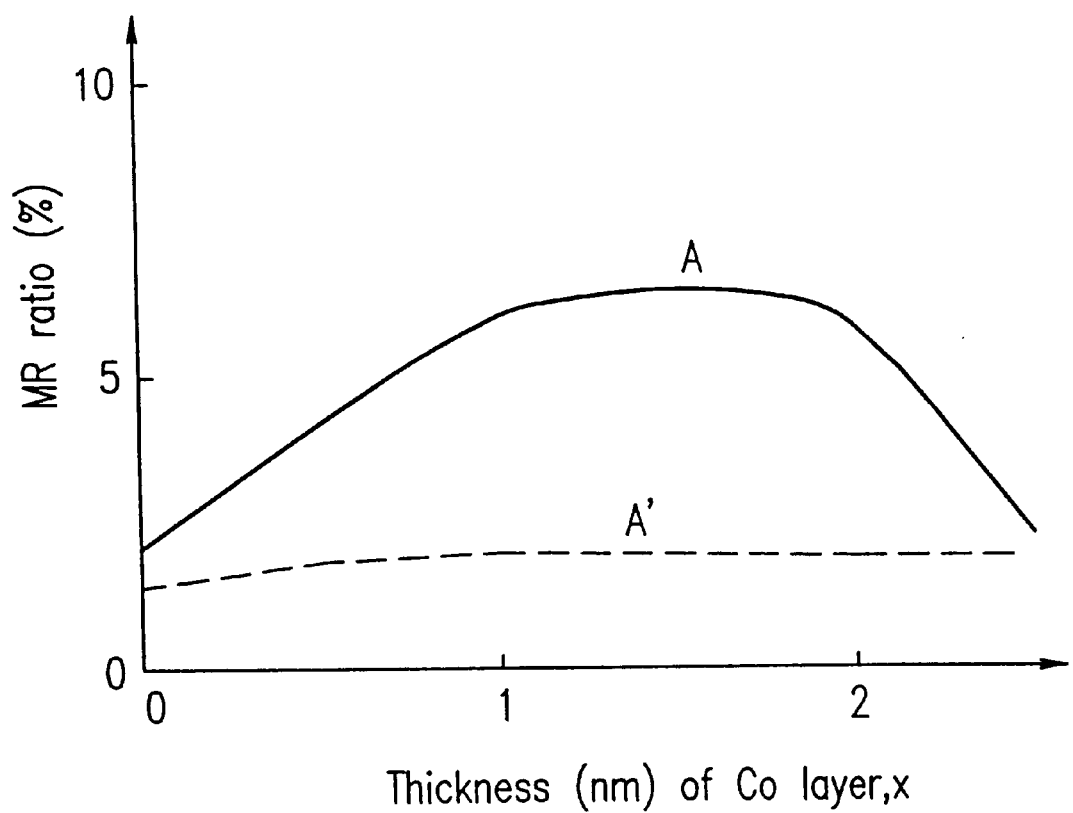
FIG. 10 is a graph representing the dependence of an MR ratio upon the thickness of a Co layer as an interface magnetic layer in an exemplary magnetoresistive device having the structure shown in FIG. 1.
Figure 11:
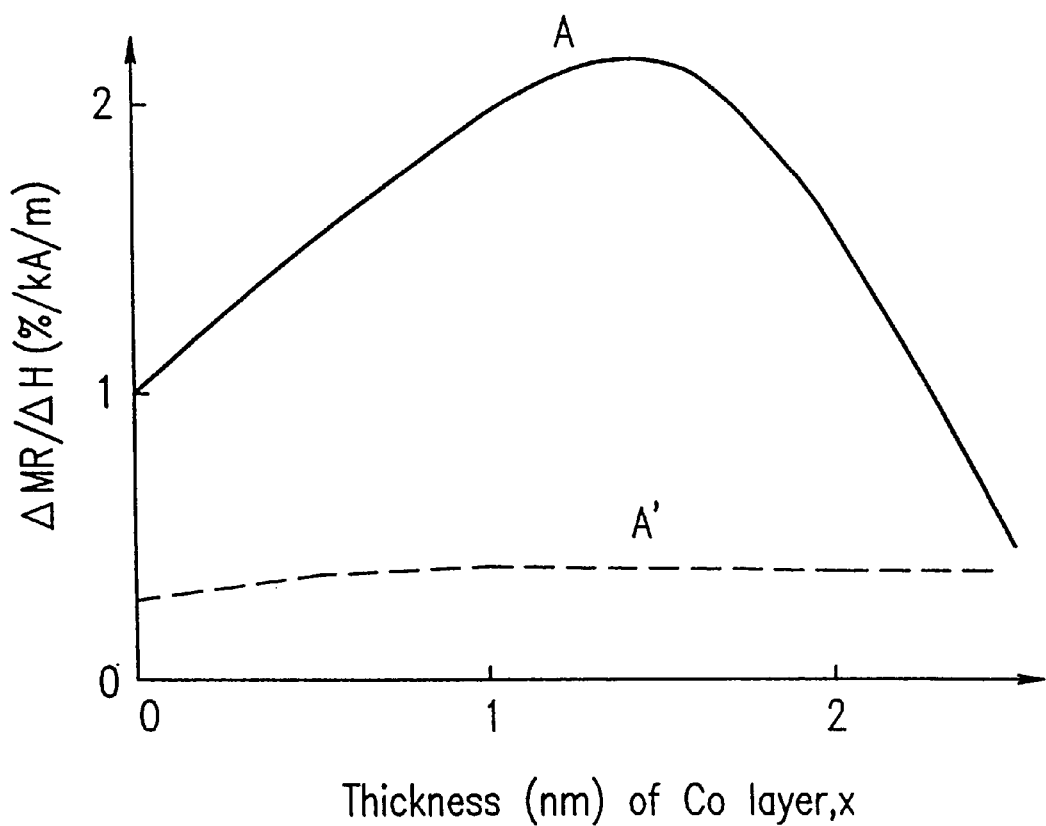
FIG. 11 is a graph representing the dependence of an MR sensitivity $\Delta MR/\Delta H$ upon the thickness of the Co layer as the interface magnetic layer in the exemplary magnetoresistive device having the structure shown in FIG. 1.

The characteristics of the MR devices A0 and A1 fabricated in such a manner were evaluated by a direct current four-terminal method by applying an external magnetic field of about 500 Oe at room temperature. The evaluation results are shown in FIGS. 10 and 11. As seen from FIG. 10, the MR device A0 of the present invention has a larger MR ratio than that of the comparative device A1. This is probably because a soft magnetic layer made of an Ni—Fe alloy has a coercive force which is not so much different from that of a hard magnetic layer 4. Thus, in a conventional structure, it is difficult to realize the antiparallel alignment of the magnetizations.

In addition, in the device A0, the Co layer 2 is inserted as the interface magnetic layer into the interface between the non-magnetic layer 3 and the amorphous alloy layer 1. Thus, when the thickness of the Co layer 2 is small, the MR ratio and the value of the MR sensitivity $\Delta MR/\Delta H$ are increased as shown in FIGS. 10 and 11. The increase in MR ratio and MR sensitivity $\Delta MR/\Delta H$ presumably results from the improvement of the soft magnetic characteristics of the amorphous alloy layer caused by the insertion of the Co layer. Another cause for the increase in MR ratio presumably lies in that the degree of the magnetic scattering of conduction electrons is larger in the interface between the non-magnetic layer 3 and the Co layer 2 than in the interface between the non-magnetic layer 3 and amorphous alloy layer 1. As shown in FIG. 10, the MR ratio is remarkably increased when the thickness of the Co layer 2 is. equal to or larger than about 0.8 nm but the MR ratio is rather decreased when the thickness of the Co layer 2 is equal to or larger than 2 nm. The reasons for the decrease in MR ratio are probably as follows: when the Co layer 2 as the interface magnetic layer becomes too thick, the soft magnetic characteristics of the combination of the interface magnetic layer and the amorphous alloy layer are degraded, so that the antiparallel alignment of the magnetizations cannot be established easily.

When the MR device A0 (where the thickness (x) of the Co layer 2 is about 1.5 nm) was reserved within a thermostatic oven at 50° C. under an atmospheric pressure for a month, an oxide layer having a thickness of about 0.5 nm was formed on the surface of the Co layer as the hard magnetic layer, so that the MR ratio increased up to about 8%. On the other hand, substantially the same effects were attained in the case where an Ni—O layer or a Co—O layer having a thickness of about 0.5 nm were formed on the Co layer as the hard magnetic layer by sputtering using an Ni target or a Co target while mixing an $O_2$ gas (about 10%) as a sputtering gas into the Ar gas (instead of annealing the fabricated device in the above-described manner) after the MR device A0 had been formed. In this example, an Ni—O layer or a Co—O layer is assumed to be formed as an oxide layer. However, the present invention is also applicable to the case of fabricating an Fe—O layer or an Fe—Co—O layer in substantially the same way. The magnetic characteristics of such oxide layers are variable depending upon the composition thereof (i.e., sometimes these oxide layers become antiferromagnetic layers and sometimes hard magnetic layers). However, in any case, by combining such oxide layer with the metal magnetic layer, the increased coercive force is obtained, and the magnetization direction of the hard magnetic layer 4 is fixed, thereby increasing the MR ratio.

On the other hand, an MR device A2 having a similar structure except for including an oxide magnetic layer as the hard magnetic layer was fabricated. The specific structure of the MR device A2 is as follows.

A2: $Co_{0.68}Mn_{0.06}B_{0.26}$ (2 nm)/Co (1.5 nm)/Cu (2 nm)/Co—O (2 nm)

the MR ratio thereof became slightly lower (i.e., about 4.2%). However, in this device A2, since the coercive force of the Co—O layer was about 100 Oe (i.e., about twice as strong as that of the Co layer), it can be seen that the device A2 has a stabler output with respect to an external large magnetic field applied accidentally.

Furthermore, in order to compensate for the disadvantages of the MR device A2, the following structure was modeled:

A3: $Co_{0.68}Mn_{0.06}B_{0.26}$ (2 nm)/Co (1.5 nm)/Cu (2 nm)/Co (1.5 nm)/Co—O (2 nm)

The MR ratio of the MR device A3 was about 6.5% and the coercive force of the hard magnetic layer 4 was as excellent as that of the device A2. The increase in MR ratio of the device A3 presumably results from the enhanced effect of the spin-dependent scattering of the conduction electrons caused by the newly provided interface between Co and Cu.

In the MR devices A0, A2 and A3 of the present invention, a Co—Mn—B layer is used as the amorphous alloy layer. However, the corrosion resistance of the Co—Mn—B layer and a Co—Fe—B layer is slightly deteriorated under extremely bad conditions (e.g., in water or in saline water). In order to eliminate such a disadvantage, a Co—Nb—Zr layer may be used. When an MR device A4 having the following structure was modeled in a similar manner to the MR device A3 except for using $Co_{0.85}Nb_{0.1}Zr_{0.05}$ as a target, A4: $Co_{0.85}Nb_{0.1}Zr_{0.05}$ (2 nm)/Co (1.5 nm)/Cu (2 nm)/Co (1.5 nm)/Co—O (2 nm)

the MR ratio thereof was about 5.5%.

In the foregoing description, a Co—O layer is assumed to be formed as an oxide layer. However, the present invention is effectively applicable in substantially the same way to the cases of forming an Fe—O layer and an Fe—Co—O layer.

Furthermore, in order to examine the characteristics of the non-magnetic layer, the following three types of devices A5, A6 and A7 were fabricated by replacing the Cu layer (2 nm) of the device A0 by the following three types of multilayer:

A5: $Co_{0.68}Mn_{0.06}B_{0.26}$ (2 nm)/Co (1.5 nm)/Cu (0.9 nm)/Ag (0.2 nm)/Cu (0.9 nm)/Co (2 nm)

A6: $Co_{0.68}Mn_{0.06}B_{0.26}$ (2 nm)/Co (1.5 nm)/Ag (0.2 nm)/Cu (1.8 nm)/Co (2 nm)

A7: $Co_{0.68}Mn_{0.06}B_{0.26}$ (2 nm)/Co (1.5 nm)/Ag (0.2 nm)/Cu (1.8 nm)/Ag (0.2 nm)/Co (2 nm)

Though the MR ratios of these devices A5, A6 and A7 were approximately the same as that of the device A0 including the Co layer having a thickness of 1.5 nm, the MR sensitivity of these devices was increased substantially twofold. This is presumably because the inserted Ag layer has a function of weakening the interaction between magnetic layers. Though an Ag layer is herein assumed to be inserted, the present invention is effectively applicable in substantially the same way to the case of inserting an Au layer.

Next, an MR head shown in FIG. 9 was formed by using the device A0 as the MR device 7 of the present invention and the characteristics of the MR head were evaluated. In this case, the shields 8 and 13 were made of an $Ni_{0.8}Fe_{0.2}$ alloy, the insulating layers 9 and 12 were made of $Al_2O_3$, the hard biasing portion 11 was made of a Co—Pt alloy and the lead portion 10 was formed of Au. In addition, the magnetization directions of the MR device 7 was adjusted so that the magnetization easy axis of the hard magnetic layer is perpendicular to the sheet surface in FIG. 9 and the magnetization easy axis of the soft magnetic layer is perpendicular to that of the hard magnetic layer (i.e., a lateral direction in FIG. 9). Such an adjustment can be achieved by forming the hard magnetic layer while applying a magnetic field using a permanent magnet to the direction to which an anisotropy was desirably provided.

As a comparative example, an MR head including the comparative MR device A1 as described above was fabricated in a similar manner. When the outputs of these MR heads were measured by applying an AC signal magnetic field of about 10 Oe to these heads so that the magnetic field coincides with the magnetization direction of the pinned layer (the hard magnetic layer), the output of the MR head of the present invention was about 5 times as high as that of the conventional MR head using an Ni—Fe alloy.

EXAMPLE 2

An MR device B0 having the following structure of the type shown in FIG. 2 was fabricated by a similar method as that used in the first example:

B0: $Co_{0.5}Fe_{0.5}$ (3 nm)/Cu (2.5 nm)/Co (1.5 nm)/$Co_{0.72}Mn_{0.08}B_{0.2}$ (2 nm)/Co (1.5 nm)/Cu (2.5 nm)/$Co_{0.5}Fe_{0.5}$ (3 nm)

As a comparative example, a device B1 having the following structure including all the layers but the interface magnetic layer 2 shown in FIG. 2 was also fabricated:

B1: $Co_{0.5}Fe_{0.5}$ (3 nm)/Cu (2.5 nm)/$Co_{0.72}Mn_{0.08}B_{0.2}$ (2 nm)/Cu (2.5 nm)/$Co_{0.5}Fe_{0.5}$ (3 nm)

Furthermore, a device B2 using an Ni—Fe alloy layer as a soft magnetic layer was also modeled:

B2: $Co_{0.5}Fe_{0.5}$ (3 nm)/Cu (2.5 nm)/Co (1.5 nm)/$Ni_{0.8}Fe_{0.2}$ (2 nm)/Co (1.5 nm)/Cu (2.5 nm)/$Co_{0.5}Fe_{0.5}$ (3 nm)

The MR ratios of these devices B0, B1 and B2 were evaluated by a similar method as that used in the first example. As a result, the MR ratios of these devices B0, B1 and B2 were about 10.1%, about 2.2% and about 3.2%, respectively. In the MR device B0 of the present invention, the soft magnetic characteristics of the soft magnetic layer (or the amorphous alloy layer 1) are excellent and a Co/Cu interface is provided, so that a large MR ratio is realized.

Furthermore, a device B3 in which an interface magnetic layer 2 is inserted into each interface between the hard magnetic layer 4 and the non-magnetic layer 3 was fabricated by a similar method as that described above:

B3: $Co_{0.5}Fe_{0.5}$ (3 nm)/Co (0.5 nm)/Cu (2.5 nm)/Co (1.5 nm)/$Co_{0.72}Mn_{0.08}B_{0.2}$ (2 nm)/Co (1.5 nm)/Cu (2.5 nm)/C (0.5 nm)/$Co_{0.5}Fe_{0.5}$ (2 nm)

The MR ratio of this device B3 was measured by the same method as that described above. As a result, the MR ratio further increased up to about 11.9%. This result tells that the interface magnetic layer 2 has an effect of increasing the MR ratio even when the interface magnetic layer 2 is provided in the interface between the hard magnetic layer 4 and the non-magnetic layer 3.

Moreover, as a comparative example, a device B4 including a hard magnetic layer made of a $Co_{0.2}Fe_{0.8}$ alloy was fabricated by a similar method as that used for fabricating the device B0:

B4: $Co_{0.2}Fe_{0.8}$ (3 nm)/Cu (2.5 nm)/Co (1.5 nm)/$Co_{0.72}Mn_{0.08}B_{0.2}$ (2 nm)/Co (1.5 nm)/Cu (2.5 nm)/$Co_{0.2}Fe_{0.8}$ (3 nm)

The MR ratio of this device B4 was about 4.3%, which was considerably lower than that of the device B0. Moreover, the square ratios of the hard magnetic layers of the devices B4 and B0 were measured based on the magnetization curves. As a result, the square ratio of the device B4 was about 0.6, whereas that of the device B0 of the present invention was about 0.87. That is to say, as seen from this example, the square ratio of a hard magnetic layer is required to be 0.7 or more.

EXAMPLE 3

An MR device C0 having the following structure of the type shown in FIG. 3 using an antiferromagnetic layer was fabricated by a similar method as that used in the first example:

C0: $Co_{0.68}Mn_{0.06}B_{0.26}$ (3 nm)/Co (1.5 nm)/Cu (2 nm)/$Ni_{0.8}Fe_{0.2}$ (3 nm)/$Ni_{0.44}Mn_{0.56}$ (10 nm)

As a comparative example, an MR device C1 having the following structure using an Ni—Fe alloy layer as a soft magnetic layer was also modeled:

C1: $Ni_{0.8}Fe_{0.2}$ (3 nm)/Co (1.5 nm)/Cu (2 nm)/$Ni_{0.8}Fe_{0.2}$ (3 nm)/$Ni_{0.44}Mn_{0.56}$ (10 nm)

The characteristics of these MR devices C0 and C1 were evaluated by a similar method as that used in the first example. As a result, the MR ratios of these two devices were substantially equal to each other. However, comparing the slopes of the MR curves (i.e., the values of the MR sensitivity $\Delta MR/\Delta H$), the device C0 has a slope approximately twice as steep as that of the device C1. This is presumably because the device C0 using an amorphous alloy and a Co layer as a soft magnetic layer has more satisfactory soft magnetic characteristics.

In this example, a Co layer is assumed to be used as an interface magnetic layer. However, even when $Co_{0.9}Fe_{0.1}$ was used for the interface magnetic layer, substantially the same result was obtained. Also, in this example, an Ni—Mn alloy was used for a metal antiferromagnetic layer 6. Alternatively, the present invention is effectively applicable to the cases of using an Ir—Mn alloy, a Pd—mn alloy, a Pt—Mn alloy, a Fe—Ir alloy and the like.

Next, an MR head shown in FIG. 9 was formed by using the device C0 as the MR device 7 of the present invention and the characteristics of the MR head were evaluated. In this case, the shields 8 and 13 were made of an $Ni_{0.8}Fe_{0.2}$ alloy, the insulating layers 9 and 12 were made of $Al_2O_3$, the hard biasing portion 11 was made of a Co—Pt alloy and the lead portion 10 was made of Au. In addition, an anisotropy was provided such that the magnetization easy axis of the magnetic layer 5 and that of the soft magnetic layer respectively became parallel and vertical to the magnetic field direction corresponding to the signal to be detected. In this method, when the magnetic layer was deposited, a magnetic field was applied by a permanent magnet to the direction within the layer to which an anisotropy was desirably applied.

As a comparative example, an MR head was fabricated in a similar manner except that an $Ni_{0.8}Fe_{0.2}$ alloy was used for the MR device 7. When the outputs of these MR heads were measured by applying an AC signal magnetic field of about 10 Oe to these heads, the output of the MR head of the present invention was about 4 times as high as that of a conventional MR head.

EXAMPLE 4

An MR device D0 having the following structure of the type shown in FIG. 4, which includes a combination of an antiferromagnetic layer and a magnetic layer in place of a hard magnetic layer, was fabricated by a similar method as that used in the third example:

D0: Ta (10 nm)/$Ni_{0.44}Mn_{0.56}$ (10 nm)/$Ni_{0.8}Fe_{0.2}$ (2 nm)/Cu (2 nm)/Co (1 nm)/$Co_{0.68}Mn_{0.26}B_{0.26}$ (3 nm)/Co (1 nm)/Cu (2 nm)/$Ni_{0.8}Fe_{0.2}$ (2 nm)/$Ni_{0.44}Mn_{0.56}$ (10 nm)

As a comparative example, an MR device D1 of the type without interface magnetic layers 2 was also modeled:

D1: Ta (10 nm)/$Ni_{0.44}Mn_{0.56}$ (10 nm)/$Ni_{0.8}Fe_{0.2}$ (2 nm)/Cu(2 nm)/$Co_{0.68}Mn_{0.06}B_{0.26}$ (3 nm)/Cu (2 nm)/$Ni_{0.8}Fe_{0.2}$ (2 nm)/$Ni_{0.44}Mn_{0.56}$ (10 nm)

The characteristics of these MR devices D0 and D1 were evaluated by the same method as that used in the first example. As a result, the MR ratio of the MR device D0 was about 9.5%, whereas the MR ratio of the device D1 was about 2.6%. The $\Delta MR/\Delta H$ value of the device D0 was approximately four times as high as that of the device D1. This result also proves the effects attained by the interface magnetic layers.

EXAMPLE 5

An MR device E0 having a structure shown in FIG. 5 was fabricated on a substrate (for example, a glass substrate) by an RF magnetron sputtering apparatus with six targets. The specific structure of the MR device E0 is as follows:

E0: $Co_{0.68}Mn_{0.06}B_{0.26}$ (2 nm)/Cu (2 nm)/$Co_{0.68}Mn_{0.06}B_{0.26}$ (2 nm)/$Ir_{0.2}Mn_{0.8}$ (10 nm)

where the numerical values in parentheses indicate layer thicknesses.

A comparative MR device E1 having the following structure including soft magnetic layers made of an Ni—Fe alloy was fabricated by a similar method.

E1: $Ni_{0.8}Fe_{0.2}$ (2 nm)/Cu (2 nm)/$Ni_{0.8}Fe_{0.2}$ (2 nm)/$Ir_{0.2}Mn_{0.8}$ (10 nm)

The following Table 1 shows the results of the characteristics of the MR devices E0 and E1 fabricated in such a manner which were evaluated by a direct current four-terminal method in which an external magnetic field of about 500 Oe was applied at room temperature.

TABLE 1

| Sample Name | MR ratio (%) | $\Delta MR/\Delta H$ (% kA/m) |
| --- | --- | --- |
| E0 | 3.1 | 1 |
| E1 | 1.9 | 0.3 |

As seen from Table 1, the MR device E0 of the present invention has a larger MR ratio and a higher MR sensitivity $\Delta MR/\Delta H$ than those of the comparative MR device E1. The reason is probably as follows: because the MR device E0 uses an amorphous alloy having excellent soft magnetic characteristics for a soft magnetic layer, the MR sensitivity of the device E0 has been improved.

Next, an MR head shown in FIG. 9 was formed by using the device E0 of the present invention as the MR device 7 and the characteristics of the MR head were evaluated. In this case, the shields 8 and 13 were made of an $Ni_{0.8}Fe_{0.2}$ alloy, the insulating layers 9 and 12 were made of $Al_2O_3$, the hard biasing portion 11 was made of a Co—Pt alloy and the lead portion 10 was made of Au. In addition, an anisotropy was provided such that the magnetization easy axis of one of the amorphous alloy layers 1 in contact with the metal antiferromagnetic layer 6 and the magnetization easy axis of the other amorphous alloy layer 1 functioning as a free layer respectively became parallel and vertical to the magnetic field direction corresponding to the signal to be detected. In this method, when the metal antiferromagnetic layer and the soft magnetic layer contacting the metal antiferromagnetic layer were deposited, a magnetic field was applied by a permanent magnet to the direction within the layer to which an anisotropy was desirably applied.

As a comparative example, an MR head was fabricated in a similar manner except that the comparative MR device E1 including an $Ni_{0.8}Fe_{0.2}$ alloy was used for the MR device 7. When the outputs of these MR heads were measured by applying an AC signal magnetic field of about 10 Oe to these heads, the output of the MR head using the MR device E0 of the present invention was about 3 times as high as that of a conventional MR head using the comparative MR head E1.

In this example, a Co—Mn—B layer is assumed to be used as an amorphous alloy layer. However, the corrosion resistance of a Co—Mn—B layer and a Co—Fe—B layer is slightly deteriorated under extremely bad conditions, (e.g., in water or in saline water). In order to eliminate such a disadvantage, a Co—Nb—Zr layer may be used. When an MR device E2 having the following structure was modeled in a similar manner except for using $Co_{0.85}Nb_{0.1}Zr_{0.05}$ as a target, E2: $Co_{0.85}Nb_{0.05}Zr_{0.05}$ (2 nm)/Cu (2 nm)/$Co_{0.85}Nb_{0.1}Zr_{0.05}$ (2 nm)/$Ir_{0.2}Mn_{0.8}$ (10 nm)

the MR device E2 exhibited excellent characteristics: the MR ratio thereof was about 2.9% and the MR sensitivity $\Delta MR/\Delta H$ was 0.8%.

Furthermore, in order to examine the characteristics of the non-magnetic layer, the following three types of devices E3, E4 and E5 were fabricated by replacing the Cu layer (2 nm) by the following three types of multilayer.

E3: $Co_{0.68}Mn_{0.06}B_{0.26}$ (2 nm)/Cu (0.9 nm)/Ag (0.2 nm)/Cu (0.9 nm)/$Co_{0.68}Mn_{0.06}B_{0.26}$ (2 nm)/$Ir_{0.2}Mn_{0.8}$ (10 nm)

E4: $Co_{0.68}Mn_{0.06}B_{0.26}$ (2 nm)/Ag (0.2 nm)/Cu (1.8 nm)/$Co_{0.68}Mn_{0.06}B_{0.26}$ (2 nm)/$Ir_{0.2}Mn_{0.8}$ (10 nm)

E5: $Co_{0.68}Mn_{0.06}B_{0.26}$ (2 nm)/Cu (1.8 nm)/Ag (0.2 nm)/$Co_{0.68}Mn_{0.06}B_{0.26}$ (2 nm)/$Ir_{0.2}Mn_{0.8}$ (10 nm)

These MR devices E3, E4 and E5 were evaluated in a similar manner to that described in the first example. Though the MR ratios of these MR devices E3, E4 and E5 were approximately the same as that of the device E0, the MR sensitivity of these devices was increased by a factor substantially equal to 1.5. This is presumably because the inserted Ag layer has a function of weakening the interaction between magnetic layers. Though an Ag layer is herein assumed to be inserted, the present invention is effectively applicable in substantially the same way to the case of inserting an Au layer.

Also, in this example, an Ir—Mn alloy was used for the metal antiferromagnetic layer 6. Alternatively, the present invention is applicable to the cases of using a Pt—Mn alloy, a Pd—mn alloy, a Ni—Mn alloy, a Fe—Ir alloy and the like.

EXAMPLE 6

An MR device F0 having a structure shown in FIG. 7 was fabricated on a substrate (for example, a glass substrate) by a similar method as that used in the fifth example. The specific structure of the MR device F0 is as follows:

F0: $Ir_{0.2}Mn_{0.8}$ (10 nm)/$Co_{0.68}Mn_{0.06}B_{0.26}$ (2 nm)/Cu (2 nm)/$Co_{0.68}Mn_{0.06}B_{0.26}$ (2 nm)/Cu (2 nm)/$Co_{0.68}Mn_{0.06}B_{0.26}$ (2 nm)/$Ir_{0.2}Mn_{0.8}$ (10 nm)

As a comparative conventional example, an MR device F1 having the following structure in which the $Co_{0.68}Mn_{0.06}B_{0.26}$ layer as the amorphous alloy layer is replaced by an $Ni_{0.8}Fe_{0.2}$ layer was also modeled:

F1: $Ir_{0.2}Mn_{0.8}$ (10 nm)/$Ni_{0.8}Fe_{0.2}$ (2 nm)/Cu (2 nm)/$Ni_{0.8}Fe_{0.2}$ (2 nm)/Cu (2 nm)/$Ni_{0.8}Fe_{0.2}$ (2 nm)/$Ir_{0.2}Mn_{0.8}$ (10 nm)

The following Table 2 shows the results of the characteristics of the devices F0 and F1 fabricated in such a manner which were evaluated by the same method as that used in the fifth example.

TABLE 2

| Sample Name | MR ratio (%) | $\Delta MR/\Delta H$ (% kA/m) |
|---|---|---|
| F0 | 5.2 | 1.7 |
| F1 | 3.6 | 0.5 |

As seen from Table 2, the MR device F0 of the present invention has a larger MR ratio and a higher MR sensitivity $\Delta MR/\Delta H$ than those of the comparative MR device F1. The reason is probably as follows: because the MR device F0 uses an amorphous alloy having excellent soft magnetic characteristics for a soft magnetic layer, the MR sensitivity of the MR device F0 has been improved.

Next, an MR head shown in FIG. 9 was formed by using the MR device F0 of the present invention as the MR device 7 and the characteristics of the MR head were evaluated in the same way as in the first example. In addition, for comparison, an MR head having a structure shown in FIG. 9 which includes the comparative MR device F1 was fabricated in a similar manner. This MR head was evaluated in a similar manner to that used in the first example. As a result, the output of the MR head of the present invention was about twice as high as that of the MR head using the comparative MR device F1.

EXAMPLE 7

An MR device G0 having a structure shown in FIG. 6A was fabricated on a substrate, such as a glass substrate, by an RF magnetron sputtering apparatus using a ternary target. The specific structure of the MR device G0 is as follows:

G0: $Co_{0.68}Mn_{0.06}B_{0.26}$ (2 nm)/Co (t nm)/Cu (2 nm)/Co (t nm)/$Co_{0.68}Mn_{0.06}B_{0.26}$ (2 nm)/$Ir_{0.2}Mn_{0.8}$ (10 nm)

where the numerical values in parentheses indicate layer thicknesses. In this MR device G0, the layer thickness t of the Co layers was varied to be selected from the range of about 0 to about 3 nm.

The following Table 3 shows the results of the characteristics of the device G0 fabricated in such a manner which were evaluated by a direct current four-terminal method in which an external magnetic field of about 500 Oe was applied at room temperature.

TABLE 3

| Thickness of Co layer (nm) | MR ratio (%) | $\Delta MR/\Delta H$ (% kA/m) |
|---|---|---|
| 0 | 3.1 | 1 |
| 0.2 | 4.3 | 1.3 |
| 0.5 | 5.2 | 1.4 |
| 1 | 6.2 | 1.9 |
| 1.5 | 6.0 | 1.8 |
| 2 | 6.3 | 2.1 |
| 2.5 | 4.8 | 1.0 |
| 3 | 4.5 | 0.7 |

As is clear from Table 3, both the MR ratio and the MR sensitivity $\Delta MR/\Delta H$ are considerably improved by the insertion of the Co layers between the non-magnetic layer 3 and the amorphous alloy layers 1. This means that the magnetic scattering occurring at the interface of the Co layer as the interface magnetic layer and the Cu layer as the non-magnetic layer is larger than that occurring at the interface of the $Co_{0.68}Mn_{0.06}B_{0.26}$ layer as the amorphous alloy layer and the Cu layer.

As is apparent from Table 3, though some effects can be attained when the thickness of the Co layer to be inserted is set to be about 0.2 nm, the thickness of the Co layer is preferably about 1 nm or more. However, when the thickness of the Co layer is about 2.5 nm or more, both the MR ratio and the MR sensitivity ΔMR/ΔH are decreased. This is presumably because the soft magnetic characteristics of the soft magnetic layers are deteriorated when the Co layer is too thick. As shown in Tables 1 and 3, when the thickness of the Co layer is about 2 nm or less, both the MR ratio and the MR sensitivity ΔMR/ΔH of the MR device G0 of the present invention are much improved as compared with the comparative MR device E1 described in the fifth example.

In this example, the interface magnetic layers are assumed to be inserted into both sides of the non-magnetic layer 3 as shown in FIG. 6A. Alternatively, increase of the MR ratio and improvement of the MR sensitivity ΔMR/ΔH can be attained in the cases of inserting a single interface magnetic layer to either one side of the non-magnetic layer 3 as shown in FIGS. 6B and 6C. The MR devices G2 and G3 respectively having structures shown in FIGS. 6B and 6C were fabricated on a substrate by a similar method to the fabrication method of the MR device F0. The specific structure of the MR devices G2 and G3 were as follows:

G2: $Co_{0.68}Mn_{0.06}B_{0.26}$ (2 nm)/Cu (2 nm)/Co (t nm)/$Co_{0.68}Mn_{0.06}B_{0.26}$ (2 nm)/$Ir_{0.2}Mn_{0.8}$ (10 nm)

G3: $Co_{0.68}Mn_{0.06}B_{0.26}$ (2 nm)/Co (t nm)/Cu (2 nm)/$Co_{0.68}Mn_{0.06}B_{0.26}$ (2 nm)/$Ir_{0.2}Mn_{0.8}$ (10 nm)

These MR devices G2 and G3 were evaluated in a similar method that used in the first example. The evaluation results are shown in Table 4.

TABLE 4

| Sample Name | MR ratio (%) | ΔMR/ΔH (% kA/m) |
| --- | --- | --- |
| G2 | 4.8 | 1.5 |
| G3 | 4.2 | 1.3 |

As is clear from the results shown in Table 4, even when an interface magnetic layer is inserted to either one side of a non-magnetic layer, the MR characteristics of the device are still superior to those of the device D1 including no interface magnetic layer described in the fourth example.

In this example, a Co layer is assumed to be used as an interface magnetic layer. However, substantially the same effects were attained even when $Co_{0.9}Fe_{0.1}$ was used for the interface magnetic layer.

Also, in this example, an amorphous alloy layer is assumed to be in direct contact with an antiferromagnetic layer. Alternatively, a crystalline magnetic layer may be inserted between the amorphous alloy layer and the metal antiferromagnetic layer. For comparison, an MR device G0 in which the thickness of the Co layer was 1 nm and an MR device G4 having a Ni—Fe—Co layer as the crystalline magnetic layer between the amorphous alloy layer and the metal antiferromagnetic layer were fabricated as follows:

G0: $Co_{0.68}Mn_{0.06}B_{0.26}$ (2 nm)/Co (1 nm)/Cu (2 nm)/Co (1 nm)/$Co_{0.68}Mn_{0.06}B_{0.26}$ (2 nm)/$Ir_{0.2}Mn_{0.8}$ (10 nm)

G4: $Co_{0.68}Mn_{0.06}B_{0.26}$ (2 nm)/Co (t nm)/Cu (2 nm)/Co (t nm)/$Co_{0.68}Mn_{0.06}B_{0.26}$ (2 nm)/$Ni_{0.8}Fe_{0.1}Co_{0.1}$ (1.5 nm)/$Ir_{0.2}Mn_{0.8}$ (10 nm)

These MR devices G0 and G4 were evaluated by a similar method to that used in the first example. The device G4 had an MR ratio and an MR sensitivity ΔMR/ΔH substantially equal to those of the device G0, and the magnetic field required for inverting the magnetic domain in the pinned layer of the device G4 was about 200 Oe, i.e., about twice of that (about 100 Oe) of the device G0. Consequently, the MR device G4 can be practically used as a member of a magnetic head.

EXAMPLE 8

An MR device H0 having a structure shown in FIG. 8 was fabricated by a similar method to that used in the fifth example. The specific structure of the MR device H0 was as follows:

H0: $Ir_{0.2}Mn_{0.8}$ (10 nm)/$Co_{0.68}Mn_{0.06}B_{0.26}$ (2 nm)/Co (1 nm)/Cu (2 nm)/Co (1 nm)/$Co_{0.68}Mn_{0.06}B_{0.26}$ (2 nm)/Co (1 nm)/Cu (2 nm)/Co (1 nm)/$Co_{0.68}Mn_{0.06}B_{0.26}$ (2 nm)/$Ir_{0.2}Mn_{0.8}$ (10 nm)

A comparative MR device H1 having the following structure was similarly fabricated.

H1: $Ir_{0.2}Mn_{0.8}$ (10 nm)/$Ni_{0.8}Fe_{0.2}$ (2 nm)/Co (1 nm)/Cu (2 nm)/Co (1 nm)/$Ni_{0.8}Fe_{0.2}$ (2 nm)/Co (1 nm)/Cu (2 nm)/Co (1 nm)/$Ni_{0.8}Fe_{0.2}$ (2 nm)/$Ir_{0.2}Mn_{0.8}$ (10 nm)

The following Table 5 shows the evaluation results of the characteristics of the devices H0 and H1 fabricated in such a manner which were evaluated by the same method as that used in the fifth example.

TABLE 5

| Sample Name | MR ratio (%) | ΔMR/ΔH (% kA/m) |
| --- | --- | --- |
| H0 | 6.9 | 2.3 |
| H1 | 3.3 | 0.4 |

As seen from Table 5, the MR device H0 of the present invention has a larger MR ratio and a higher MR sensitivity ΔMR/ΔH than those of the comparative MR device H1. The reason is probably as follows: because the MR device H0 uses an amorphous alloy having excellent soft magnetic characteristics for a soft magnetic layer, the MR sensitivity of the MR device H0 has been improved.

Next, an MR head shown in FIG. 9 was formed by using the MR device H0 of the present invention as the MR device 7 in a similar way to that described in the fifth example and the characteristics of the MR head were evaluated. In addition, an MR head having a structure shown in FIG. 9 which includes the comparative MR device H1 was also fabricated and evaluated. As a result, the output of the MR head of the present invention was about 7 times as high as that of a conventional MR head using the comparative MR device H1 including Ni—Fe alloy layers.

The foregoing examples have been described mainly about the cases where a Co—Mn—B alloy is used for an amorphous alloy layer. However, the present inventors confirmed that the same effects were also attained in the cases of using a Co(—Fe, Mn)—Nb—B alloy, a Co—Nb—Zr alloy and the like.

As is apparent from the foregoing description, the MR device of the present invention realizes a large MR change in a low magnetic field. Thus, if the MR device of the present invention is applied to a magnetic head, the reproduced output thereof can be considerably increased in a very weak magnetic field. In addition, since the total thickness of the MR device of the present invention can be relatively small, the MR device of the present invention will be effectively applicable to a magnetic head for super high-density recording to be developed in the near future.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A magnetoresistive device comprising:
    a soft magnetic layer;
    at least one hard magnetic layer;
    at least one non-magnetic layer formed between the soft magnetic layer and the at least one hard magnetic layer, the non-magnetic layer having a thickness of at least about 1.5 nm; and
    an interface magnetic layer, provided at an interface between the soft magnetic layer and the at least one non-magnetic layer, for enhancing a spin-dependent scattering of conduction electrons at the interface between the non-magnetic layer and the soft magnetic layer, and improving soft magnetic properties of the soft magnetic layer, the interface magnetic layer having a thickness of at least 0.2 nm,
        wherein the soft magnetic layer includes an amorphous structure, and
        an axis of easy magnetization of the hard magnetic layer substantially coincides with a direction of a magnetic field to be detected.

2. A magnetoresistive device according to claim 1, wherein the interface magnetic layer mainly contains Co or Co—Fe alloy, and have a thickness of about 2 nm or less.

3. A magnetoresistive device according to claim 1, wherein the hard magnetic layer has a ratio of remanent magnetization to saturation magnetization is about 0.7 or more.

4. A magnetoresistive device according to claim 1, wherein the hard magnetic layer is partially or entirely formed of oxide.

5. A magnetoresistive device according to claim 4, wherein the hard magnetic layer is formed of an oxide of Co or an oxide of Fe.

6. A magnetoresistive device according to claim 1, wherein the hard magnetic layer contains $Co_xFe_{1-x}$ as a main component, where x is in a range of about 0.3 to about 0.7.

7. A magnetoresistive device according to claim 1, further comprising an oxide layer formed on a side of the hard magnetic layer opposite to a side on which the non-magnetic layer is formed.

8. A magnetoresistive device according to claim 7, wherein the oxide layer is formed of an oxide of Ni.

9. A magnetoresistive device according to claim 1, further comprising an oxide magnetic layer formed on a side of the hard magnetic layer opposite to a side on which the non-magnetic layer is formed.

10. A magnetoresistive device according to claim 9, wherein the oxide magnetic layer is formed of an oxide of Co or an oxide of Fe.

11. A magnetoresistive device according to claim 6, further comprising an oxide magnetic layer formed on a side of the hard magnetic layer opposite to a side on which the non-magnetic layer is formed.

12. A magnetoresistive device according to claim 11, wherein the oxide magnetic layer is formed of an oxide of Co or an oxide of Fe.

13. A magnetoresistive device according to claim 1, wherein the non-magnetic layer includes a non-magnetic layer of a different material inserted therein.

14. A magnetoresistive device according to claim 13, wherein the non-magnetic layer of the different material has a thickness of about 1 nm or less.

15. A magnetoresistive device according to claim 1, further comprising a further interface magnetic layer provided at an interface between the hard magnetic layer and the non-magnetic layer.

16. A magnetoresistive device according to claim 15, wherein the further interface magnetic layer mainly contains Co or Co—Fe alloy and has a thickness of about 2 nm or less.

17. A magnetoresistive device according to claim 1, wherein the soft magnetic layer mainly contains Co—Mn—B alloy.

18. A magnetoresistive device according to claim 1, wherein the soft magnetic layer mainly contains Co—Nb—Zr alloy.

19. A magnetoresistive device according to claim 1, wherein the soft magnetic layer mainly contains Co—Nb—B alloy.

20. A magnetoresistive device according to claim 1, wherein the magnetoresistive device has a thickness of about 20 nm or less, but greater than zero.

21. A magnetoresistive head comprising an magnetoresistive device according to claim 20, and a lead portion.

22. A magnetoresistive device according to claim 1, wherein the non-magnetic layer has a thickness of about 10 nm or less but at least about 1.5 nm.

23. A magnetoresistive device according to claim 1, wherein the non-magnetic layer has a thickness of about 10 nm or less but at least about 1.8 nm.

24. A magnetoresistive device according to claim 1, wherein the non-magnetic layer has a thickness of about 3 nm or less but at least about 1.5 nm.

25. A magnetoresistive device according to claim 1, wherein the non-magnetic layer has a thickness of about 3 nm or less but at least about 1.8 nm.

26. A magnetoresistive device according to claim 1, wherein the interface layer has a thickness of about 2 nm or less but at least 0.2 nm.

27. A magnetoresistive device according to claim 1, wherein the interface layer has a thickness of about 2 nm or less but at least 0.8 nm.

28. A magnetoresistive device according to claim 1, wherein the interface layer has a thickness of about 1.8 nm or less but at least 0.2 nm.

29. A magnetoresistive device according to claim 1, wherein the interface layer has a thickness of about 1.8 nm or less but at least 0.8 nm.

30. A magnetoresistive device according to claim 1, wherein the soft magnetic layer including an amorphous structure has a thickness of 10 nm or less.

31. A magnetoresistive device according to claim 1, wherein the soft magnetic layer including an amorphous structure has a thickness of 5 nm or less.

32. A magnetoresistive device comprising:
    a soft magnetic layer;
    at least one hard magnetic layer;
    at least one non-magnetic layer formed between the soft magnetic layer and the at least one hard magnetic layer, the non-magnetic layer having a thickness of about 10 nm or less but at least about 1.5 nm; and
    an interface magnetic layer, provided at an interface between the soft magnetic layer and the at least one non-magnetic layer, for enhancing a spin-dependent scattering of conduction electrons at the interface between the non-magnetic layer and the soft magnetic layer, and improving soft magnetic properties of the soft magnetic layer, the interface magnetic layer having a thickness of about 2 nm or less but at least 0.2 nm,
        wherein the soft magnetic layer includes an amorphous structure and has a thickness of 10 nm or less, and
        an axis of easy magnetization of the hard magnetic layer substantially coincides with a direction of a magnetic field to be detected.

33. A magnetoresistive device comprising:

a soft magnetic layer;

at least one hard magnetic layer;

at least one non-magnetic layer formed between the soft magnetic layer and the at least one hard magnetic layer, the non-magnetic layer having a thickness of about 10 nm or less but at least about 1.5 nm; and an interface magnetic layer, provide at an interface between the soft magnetic layer and the at least one non-magnetic layer, for enhancing a spin-dependent scattering of conduction electrons at the interface between the non-magnetic layer and the soft magnetic layer, and improving soft magnetic properties of the soft magnetic layer, the interface magnetic layer having a thickness of about 2 nm or less but at least 0.2 nm, wherein the soft magnetic layer includes an amorphous structure and has a thickness of 10 nm or less but greater than zero, the magnetoresistive device has a thickness of about 20 nm or less but greater than zero, and an axis of easy magnetization of the hard magnetic layer substantially coincides with a direction of a magnetic field to be detected.

* * * * *